(12) United States Patent
Gajda et al.

(10) Patent No.: US 8,212,578 B1
(45) Date of Patent: Jul. 3, 2012

(54) TEST HEAD POSITIONER SYSTEM

(75) Inventors: Andreas Gajda, Rosenheim (DE); Hermann Weissacher, Rimsting (DE)

(73) Assignee: inTEST Corporation, Mount Laurel, NJ (US)

( * ) Notice: Subject to any disclaimer, the term of this patent is extended or adjusted under 35 U.S.C. 154(b) by 613 days.

(21) Appl. No.: 12/405,547

(22) Filed: Mar. 17, 2009
(Under 37 CFR 1.47)

Related U.S. Application Data

(60) Provisional application No. 61/037,065, filed on Mar. 17, 2008.

(51) Int. Cl.
*G01R 31/00* (2006.01)
*G01R 31/20* (2006.01)

(52) U.S. Cl. .............. 324/750.16; 324/750.25; 414/589; 414/590

(58) Field of Classification Search ............. 324/750.16, 324/750.25; 414/589, 590
See application file for complete search history.

(56) References Cited

U.S. PATENT DOCUMENTS

| | | | |
|---|---|---|---|
| 4,527,942 | A | 7/1985 | Smith |
| 4,705,447 | A | 11/1987 | Smith |
| 4,715,574 | A | 12/1987 | Holt et al. |
| 4,893,074 | A | 1/1990 | Holt et al. |
| 5,030,869 | A | 7/1991 | Holt et al. |
| 5,450,766 | A | 9/1995 | Holt |
| 5,608,334 | A | 3/1997 | Holt |
| 6,888,343 | B1 | 5/2005 | Holt et al. |
| 6,911,816 | B2 | 6/2005 | Holt et al. |
| 7,245,118 | B2 | 7/2007 | Holt et al. |
| 2005/0052176 | A1 | 3/2005 | Holt et al. |

FOREIGN PATENT DOCUMENTS

| | | |
|---|---|---|
| WO | WO 2004031782 | 4/2004 |
| WO | WO 2005015245 | 2/2005 |

*Primary Examiner* — Bot Ledynh
(74) *Attorney, Agent, or Firm* — RatnerPrestia

(57) ABSTRACT

A manipulator system comprising a column unit and a carriage supported by the column unit and configured to move along a desired axis of translation. A marker is provided on the column unit along the axis of translation. A sensor is associated with the carriage and configured to sense a position along the marker. A position display unit is configured to receive a position signal from the sensor and display a current position of the carriage along the axis of translation. In another aspect, the column unit defines at least one slot. A lock assembly is attached to the carriage and includes a tang axially moveable between an unlocked position wherein the tang is disengaged from the at least one slot and a locked position wherein the tang is engaged in the at least one slot.

10 Claims, 37 Drawing Sheets

Fig: 19

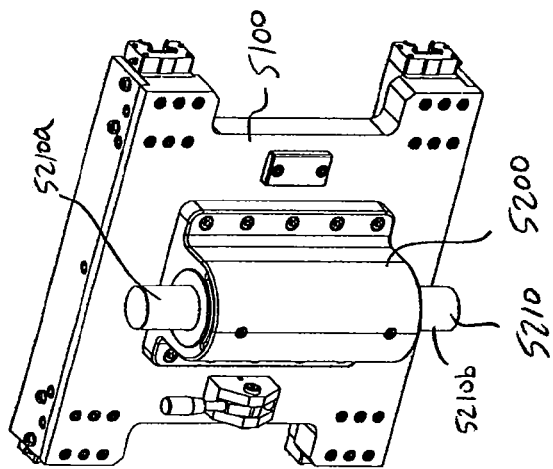
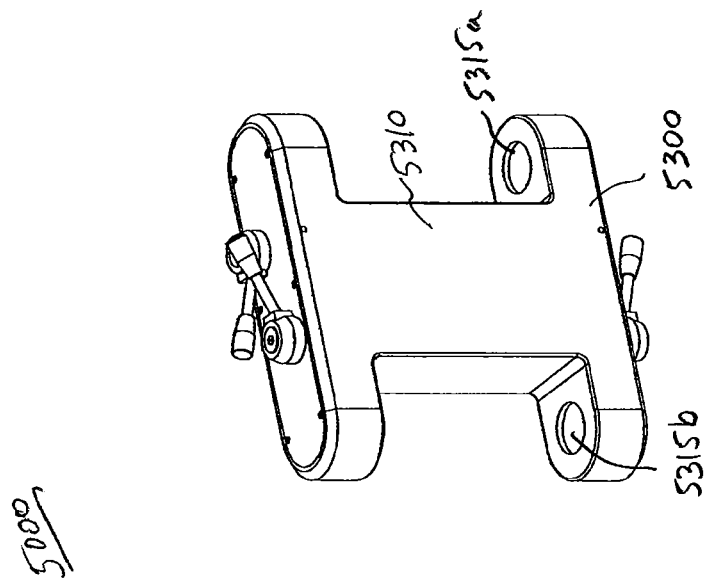
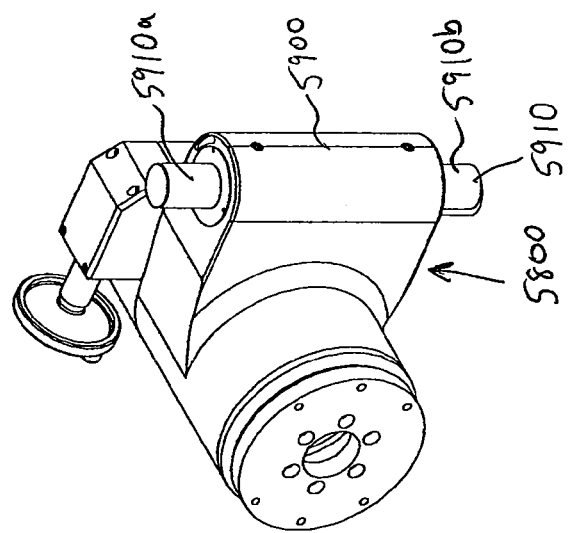
Fig. 27

TEST HEAD POSITIONER SYSTEM

FIELD OF THE INVENTION

The present invention relates to the field of art of test head positioners for automatic integrated circuit (IC) testing equipment.

BACKGROUND OF THE INVENTION

Automatic test equipment (ATE) for integrated circuits (ICs) has been developed to facilitate electrical testing of IC's at selected stages of the IC manufacturing process. Such ATE often includes a test head which must be manipulated into a docked position with a testing peripheral using a test head positioner (or manipulator). Test head positioners are generally described, for example, in U.S. Pat. Nos. 6,911,816, 6,888,343, 5,608,334, 5,450,766, 5,030,869, 4,893,074, 4,715,574, 4,705,447 and 4,527,942, WIPO publications WO 05015245A2 and WO 04031782A1, and U.S. patent application Ser. No. 10/955,441. All of the foregoing are incorporated by reference in their entirety for their teachings in the field of test head positioners for automatic test equipment for integrated circuits or other electronic devices.

Briefly, a conventional automatic testing system generally includes a peripheral apparatus for precisely placing and constraining the IC device under test (DUT) in a fixed position test site. Also included is a moveable test head for testing the DUT. The peripheral apparatus may, for example, be a wafer prober for testing devices before they are separated from a silicon wafer or a package handler for positioning and testing packaged devices. In practice, the test head is translated and/or rotated about one or more axes and brought into the vicinity of the DUT test site included in the peripheral apparatus. Prior to docking, the mating connectors of the test head and the DUT test site are precisely aligned to avoid damaging any of the fragile electrical and mechanical components. Once docked, test electronics of the test head transmit signals through various contacts of the DUT and execute particular test procedures within the DUT. In the course of testing, the test head receives output signals from the DUT, which are indicative of its electrical characteristics.

In order to precisely mate the test head with the peripheral apparatus, the test head is optionally capable of movement with all six degrees of spatial freedom. To facilitate such motion, a test head positioner system is commonly employed to precisely position the test head with respect to the peripheral. The test head positioner system may also be referred to in the art as a test head positioner or a test head manipulator.

Referring now to the exemplary test head positioner described in U.S. Pat. No. 6,888,343, the test head 502 is coupled to main arm 511, and main arm 511 is slideably coupled to linear guide rail 510 that extends vertically along the length of column 545, as best shown in FIGS. 5A and 5B. A motor 2416 may be adapted to translate main arm 511 (and test head 502) vertically along linear guide rail 510. A counter weight assembly biases the weight of main arm 511 (and test head 502) in a substantially fixed vertical position upon disengagement of the motor. As best shown in FIGS. 23 and 24, motor 2416 is mounted to frame 2422 of column 545, and is indirectly connected to pulley 2421 by timing belt 2420. Pulley 2421 is mounted to pulley 2406 by fasteners 2407 (shown in FIG. 23, but not numbered), such that pulleys 2421 and 2406 rotate simultaneously. A cable 2410 is positioned about pulley 2421. One end of cable 2410 is coupled to mount 736 of main arm 511 and the opposing end of cable 2410 is coupled to a counter balance 2413. In operation, if clutch 2426 of motor 2416 is engaged, the motor 2416 rotates pulleys 2406 and 2421, thereby translating the end of cable 2410 that is connected to mount 736 along the Y-axis. Thus, the cable 2410 translates the mount 736 of main arm 511, along with test head 502, in a vertical direction. Once clutch 2426 of motor 2416 is disengaged, the counterbalance 2413 suspends mount 736 and test head 502, in a substantially fixed vertical position. Furthermore, with clutch 2426 of motor 2416 disengaged, test head 502 is in a substantially weightless condition and may be readily moved vertically with a relatively small externally (manually) applied force. This is known as compliance and it enables an operator to manually position the test head or a docking apparatus to maneuver the test head into or out of its docked position with a peripheral.

Further, the exemplary test head positioners disclosed in WO 05015245A2, and WO 04031782A1, and U.S. Pat. No. 4,705,447 both support a test head in a substantially-weightless, compliant condition using a pneumatic apparatus rather than counter weights. In WO 05015245A2 and WO 04031782A1 a pneumatic controller is provided which, in addition to providing compliance, automates vertical translation of the test head.

The aforementioned test head positioner systems may be sufficient; nevertheless, there continues to be a need to further improve vertical support systems for test heads, in the interest of weight, efficiency, simplicity and cost.

SUMMARY OF THE INVENTION

The present invention relates to a test head manipulator system which generally includes a column unit, a vertical carriage, a cradle, an arm assembly including a roll gear box, and a base unit. The cradle is configured to hold a test head at two points, which define an axis that passes approximately through the test head's center of gravity. The test head may compliantly pivot about this axis.

The cradle is held by a roll gear box assembly which includes a hand wheel whereby rotating hand wheel drives a worm gear mechanism. Optionally, a motor may be provided to drive the worm gear mechanism. This worm gear mechanism turns a coupling to which the cradle is attached. Thus, rotating hand wheel causes rotation of the cradle and the test head about its roll axis. In an exemplary embodiment, the roll gear box provides plus/minus approximately 95 degrees of roll motion, which enables the test head to be moved to, and placed in, any dut up, dut down, dut vertical, or intermediate angular position. Roll compliance for docking may be provided by a number of known techniques, including the incorporation of Bellville washers in a manner to allow resilient axial motion of the worm gear.

The arm assembly generally includes a main arm plate with a proximal end of an upper arm assembly pivotably attached thereto by means of journals and bearings that are situated to define a vertical pivot axis. The roll gear box assembly is pivotally coupled to a distal end of the upper arm assembly, also with appropriate journals and bearings to define a second vertical pivot axis. The main arm plate is slidingly attached to the vertical carriage by means of horizontal rails and linear bearings. Horizontal side-to-side motion is provided by moving main arm plate along the horizontal rails and the associated bearings.

The combination of the two vertical pivot axes and the horizontal linear motion provides low friction motion of cradle (and the attached test head) throughout a horizontal plane with three degrees of freedom (X, Z, and rotation about Y).

The column unit includes two linear rails which extend vertically from approximately the bottom to the top thereof. The vertical carriage is coupled to the rails with appropriate linear bearings or the like. Straps connect to the vertical carriage and lead upwards to and over direction reversing pulleys located at the top of the column and thence downwards to a counterweight assembly. The counterweight assembly serves to balance the load coupled to the vertical carriage, placing the system in essentially a state of equilibrium.

In one aspect, the invention may provide a manipulator system comprising a column unit and a carriage supported by the column unit and configured to move along a desired axis of translation. A marker is provided on the column unit along the axis of translation. A sensor is associated with the carriage and configured to sense a position along the marker. A position display unit is configured to receive a position signal from the sensor and display a current position of the carriage along the axis of translation.

In another aspect, the invention may provide a manipulator system comprising a column unit defining at least one slot and a carriage supported by the column unit and configured to move along a desired axis of translation. A lock assembly is attached to the carriage. The lock assembly includes a tang axially moveable between an unlocked position wherein the tang is disengaged from the at least one slot and a locked position wherein the tang is engaged in the at least one slot.

In another aspect, the invention may provide a manipulator for positioning a load comprising a base unit including a toothed rail; and a column configured to support the load. The column is moveably supported on the base unit and includes a rotative actuator that drives a gear along the toothed rail to effect movement along the base unit.

In yet another aspect, the invention may provide a lock for an arm that pivots about an axle. The lock comprises a clamp extending about a portion of the axle and including at least one moveable portion which defines a clamping force based on its position. An actuating member is configured to engage the clamp moveable portion and is moveable between at least two positions to define at least two different clamping forces on the axle.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features may be arbitrarily expanded or reduced for clarity. Included in the drawing are the following figures:

FIG. 27 is an exploded perspective view of an exemplary arm assembly;

DETAILED DESCRIPTION OF THE INVENTION

The invention will next be illustrated with reference to the figures. Such figures are intended to be illustrative rather than limiting and are included herewith to facilitate explanation of the present invention. The figures are not necessarily to scale, and are not intended to serve as engineering drawings.

Figure 1:
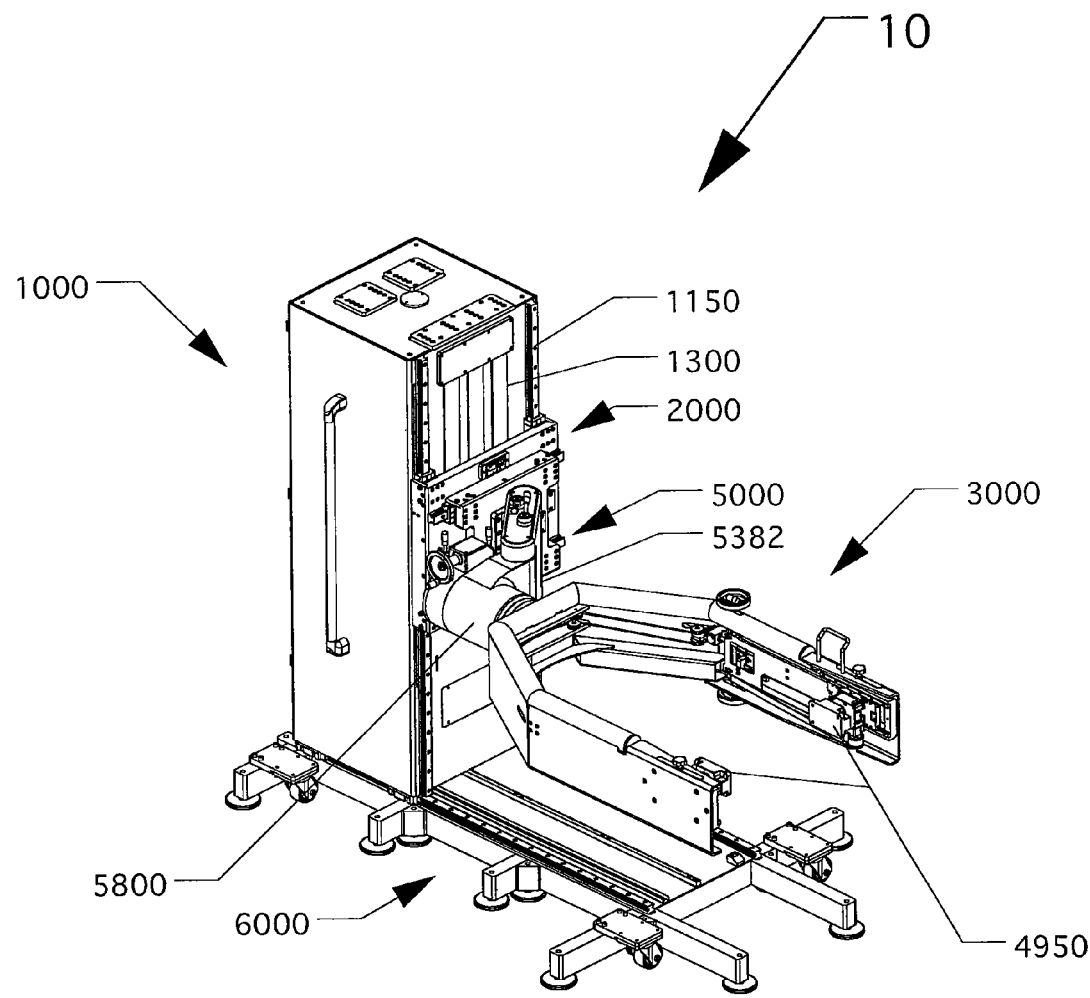
FIG. 1 is a perspective view of an exemplary test head manipulator system.
Figure 1A:
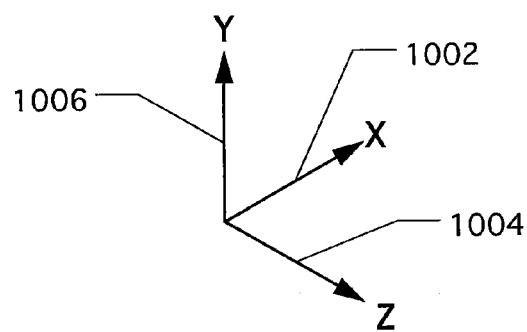
FIG. 1A is a coordinate system related to the system of FIG. 1.

To be consistent with descriptions of prior art test head positioner systems, a Cartesian coordinate system illustrated in FIG. 1A is used in which a vertical axis (otherwise referred to as a Y-axis) is denoted by axis 1006, a horizontal axis (otherwise referred to as an X-axis, side-to-side axis or left-right axis) is denoted by axis 1002, and another horizontal axis (otherwise referred to as a Z-axis or in-out axis) is denoted by axis 1004.

Figure 2:
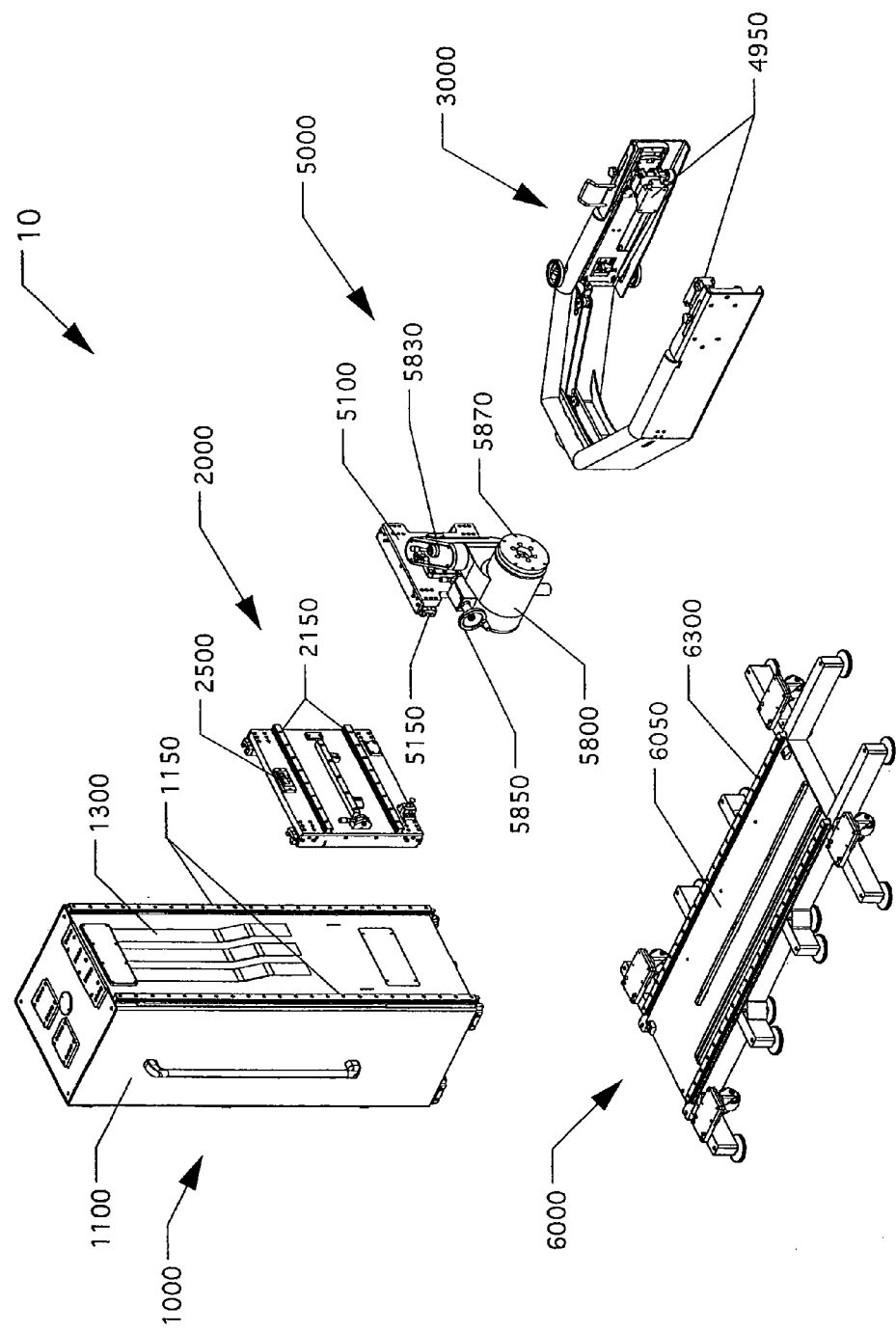
FIG. 2 is an exploded perspective view of the test head manipulator system of FIG. 1.

Test head manipulator system 10, which is a first embodiment of the present invention, will be described with reference to FIGS. 1-36. Referring to FIGS. 1 and 2, manipulator system 10 generally includes column unit 1000, vertical carriage 2000, cradle 3000, arm assembly 5000, roll gear box 5800, and base unit 6000. Not shown is the mainframe cabinet of the automatic testing equipment (ATE), the test head, and the cable, which connects the test head to the mainframe cabinet. The cable may contain various equipment, for example, electrical wiring that connects signals, power supplies, and grounds between the test head and mainframe cabinet, fiber optic signal connections, and flexible ducting for air or other gaseous coolants and/or flexible hoses and/or tubing for liquid coolants for cooling internal components, for example, densely packed very high-speed, precision circuitry.

Cradle 3000 holds a test head at two points 4950, which define an axis that passes approximately through the test head's center of gravity. The test head may compliantly pivot about this axis. Other cradles and test head holding mechanisms, providing further capabilities and more degrees of motion freedom are known in the art and may be substituted as appropriate for specific applications.

As shown in FIGS. 1 and 2, cradle 3000 is held by roll gear box assembly 5800, which includes hand wheel 5862. Rotating hand wheel 5862 drives a worm gear mechanism, which is internal to gear box assembly 5800. This worm gear mechanism turns coupling 5832 to which cradle 3000 is attached. Thus, rotating hand wheel 5862 causes rotation of cradle 3000 and the test head about its roll axis. In an exemplary embodiment, roll gear box 5800 provides plus/minus approximately 95 degrees of roll motion, which enables the test head to be moved to, and placed in, any dut up, dut down, dut vertical, or intermediate angular position. Roll compliance for docking may be provided by a number of known techniques, including the incorporation of Bellville washers in a manner to allow resilient axial motion of the worm gear. Optionally, a motor may be provided to drive the worm gear.

Arm assembly 5000 generally includes main arm plate 5100 with a proximal end of upper arm 5300 pivotably attached thereto by means of journals and bearings that are situated to define a vertical pivot axis. Roll gear box assembly 5800 is pivotally coupled to a distal end of upper arm 5300, also with appropriate journals and bearings to define a second vertical pivot axis. Thus, roll gear box assembly 5800 forms a lower arm.

Main arm plate 5100 is slidingly attached to vertical carriage 2000 by means of horizontal rails 2150 and linear bearings 5150. Horizontal side-to-side motion is provided by moving main arm plate 5100 along horizontal rails 2150 and the associated bearings 5150.

The combination of the two vertical pivot axes and the horizontal linear motion provides low friction motion of cradle 3000 (and the attached test head) throughout a horizontal plane with three degrees of freedom (X, Z, and rotation about Y).

Column unit 1000 includes two linear rails 1150 which extend vertically from approximately the bottom to the top thereof. Vertical carriage 2000 is coupled to rails 1150 with appropriate linear bearings or the like. Straps 1300 connect to vertical carriage 2000 and lead upwards to and over direction reversing pulleys (not visible) located at the top of column 1100 and thence downwards to support counterweights (not visible) also located inside column 1100. The counterweights serve to balance the load coupled to vertical carriage 2000, placing the system in essentially a state of equilibrium. As described by Smith in the aforementioned U.S. Pat. No. 4,527,942, the load is thus in a substantially weightless condition and may be moved upwards or downwards with a relatively small amount of force. As suggested in U.S. Pat. No. 7,245,118, a relatively small motor may be appropriately coupled to the system and used to drive the load vertically. Further, as also suggested in U.S. Pat. No. 7,245,118, the motor may be clutched to enable an external force to easily move the load vertically when appropriate. Thus, the load may be either driven by the motor or compliantly moved by an external force.

Base unit 6000 includes horizontally oriented base plate 6050. Linear rails 6300 are provided on base plate 6050. Linear bearings or the like couple to the bottom of column 1000 to linear rails 6300 such that column 1000 is readily linearly moveable in a plane parallel to the floor. This linear motion defines the in-out axis. Column unit 1000 is thereby provided with in-out linear motion relative to base unit 6000. As will be described, a suitable actuator mechanism may be included to provide powered in-out motion.

Referring to FIG. 1, the X-axis 1002 is oriented in a horizontal plane which is parallel with the floor, base plate 6050 and horizontal linear rails 2150 such that horizontal side-to-side motion is parallel with X-axis 1002. Z-axis 1004 is also in a horizontal plane, which is parallel with the floor and base plate 6050, and also parallel with linear rails 6300 located on base plate 6050 such that in-out motion is parallel with Z-axis 1004. Y-axis 1006 is vertical and parallel with linear rails 1150 such that up-down motion is parallel with Y-axis 1006. X-axis 1002, Y-axis 1006 and Z-axis 1004 are all mutually orthogonal.

Referring to FIGS. 3-6, base assembly 6000 will be described in more detail. Base assembly 6000 supports and provides in-out motion for column unit 1000. Column unit 1000 includes four linear bearings 1110*a,b,c,d* on its bottom surface (see FIG. 11). Linear bearings 1110*a*, 1110*b* and 1110*c*, 1110*d* are configured to engage linear rails 6300*a* and 6300*b*, respectively, which are mounted parallel to one another on base plate 6050. Thus, column unit 1000 may move horizontally along an axis defined by linear rails 6300*a* and 6300*b*. Linear bearings 1110*a,b,c,d* are desirably attached so as to be in precise engagement with linear rails 6300*a,b* such that column unit 1000 may be readily moved along a linear in-out axis with very low friction. Motion-limiting stop blocks 6013 are fixed to the front and rear of base plate 6050 and in cooperation with stop units 1113 and 1114 attached to the underside of column unit 1000 are provided to stop and constrain forward and rearward motion respectively of column unit 1000 as described in more detail below.

Figure 3:
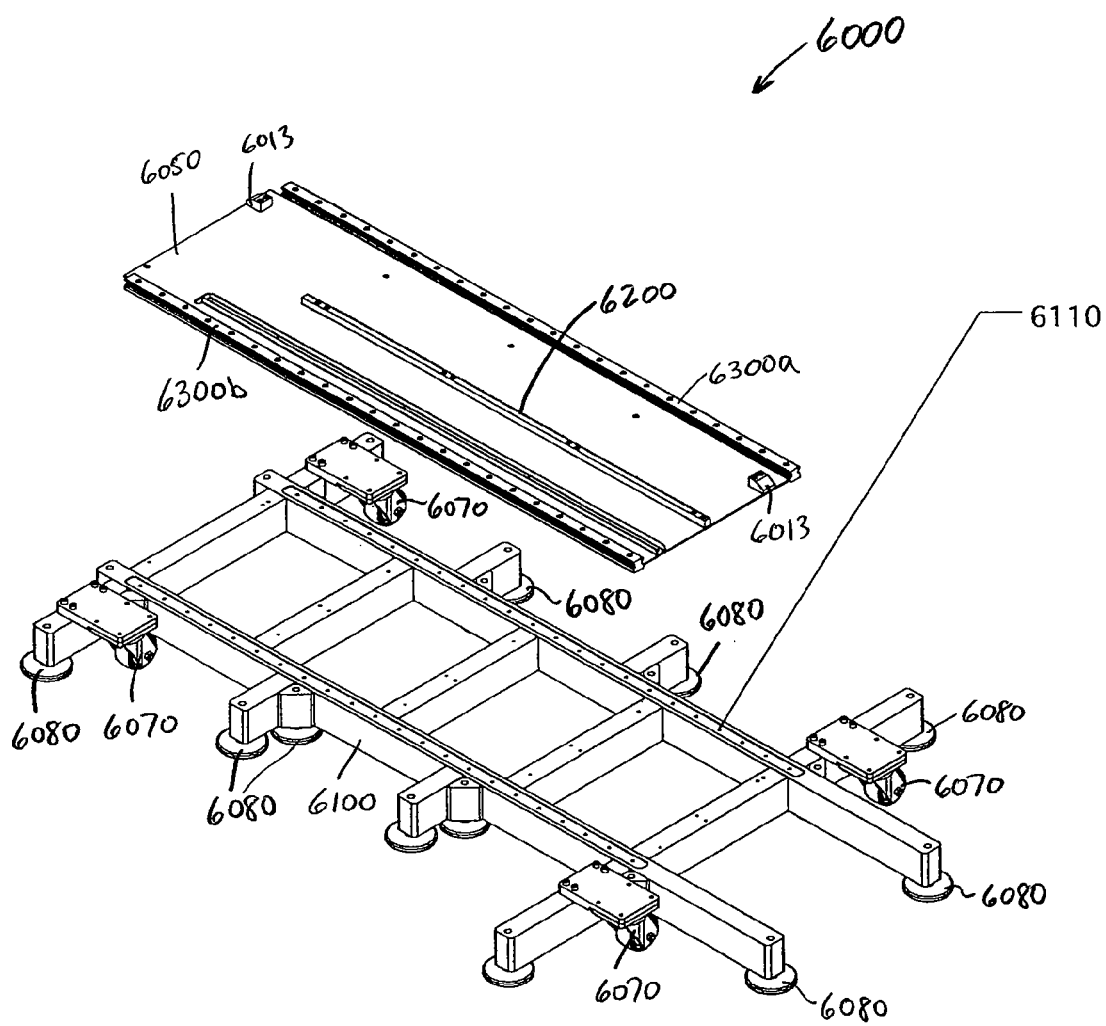
FIG. 3 is an exploded perspective view of an exemplary base assembly of the test head manipulator system of FIG. 1.
Figure 4:
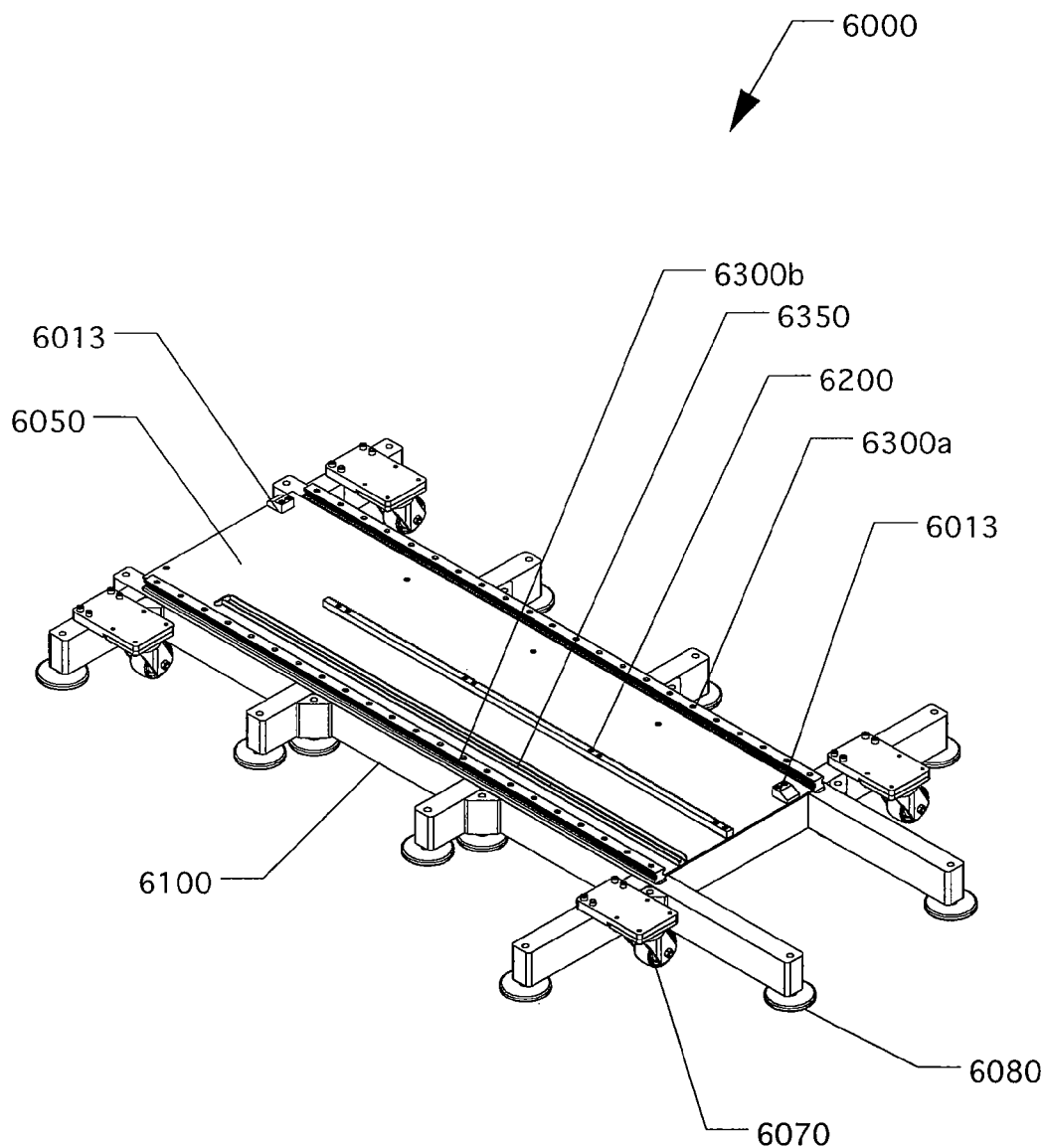
FIG. 4 is an assembled perspective view of the base assembly of FIG. 3.
Figure 5:
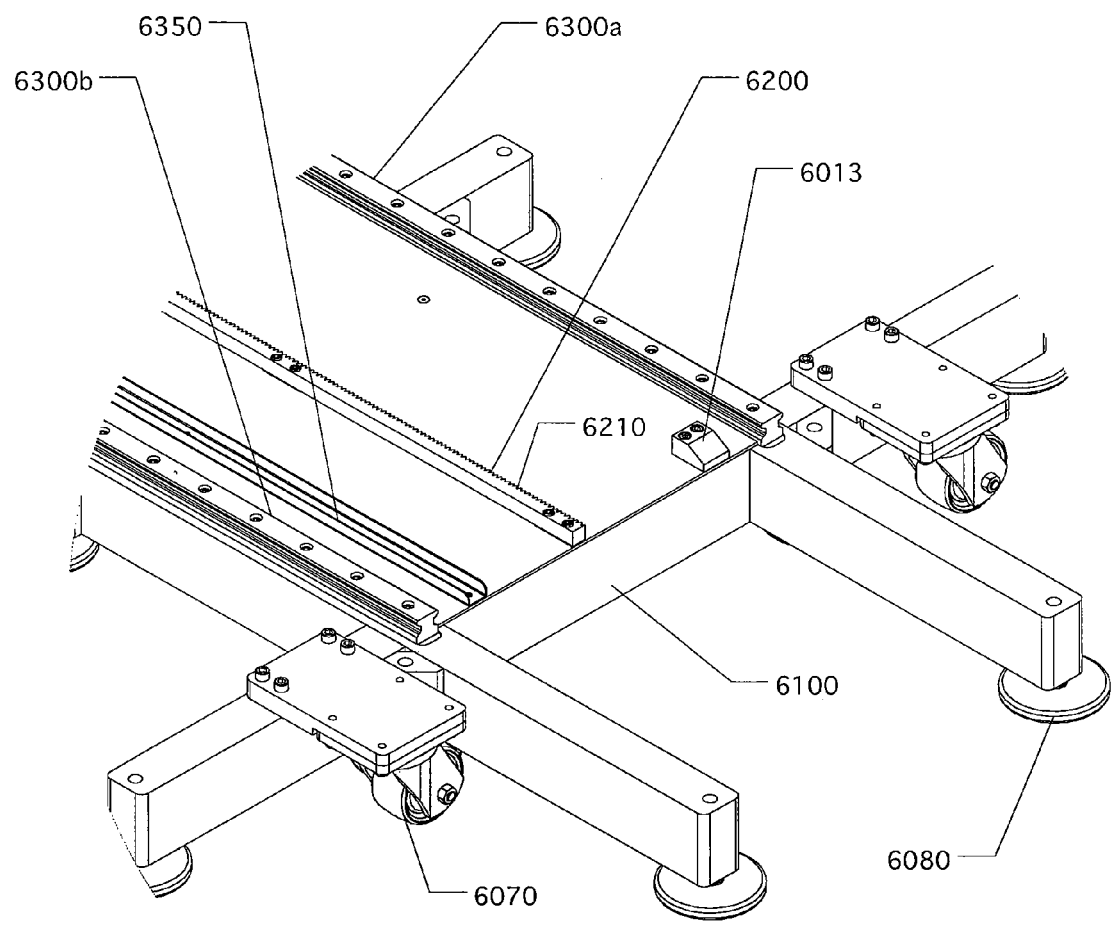
FIG. 5 is an expanded perspective view of a portion of the base assembly of FIG. 3.
Figure 6:
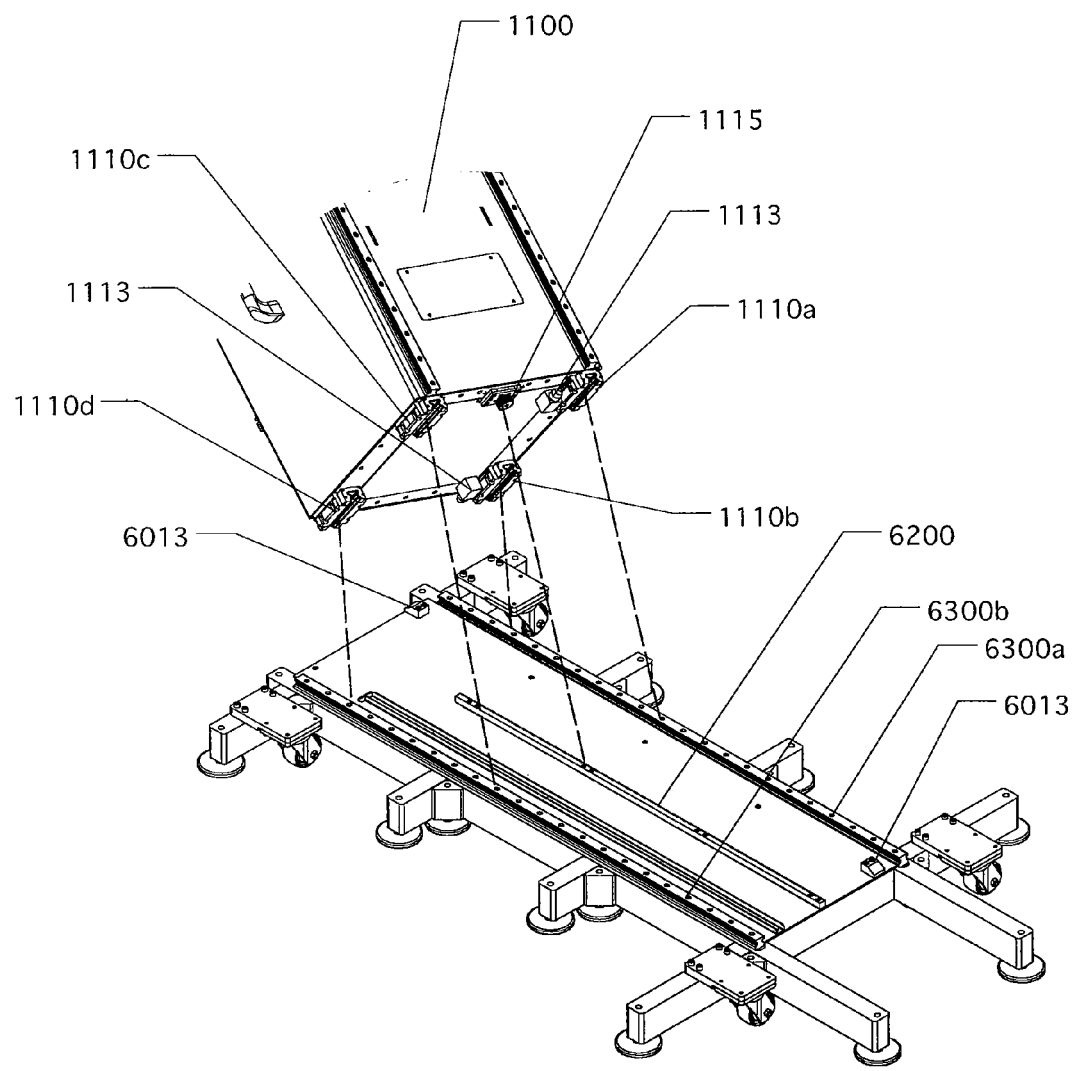
FIG. 6 is a perspective view of the base assembly similar to FIG. 3 illustrating relative positioning of the column unit with respect thereto.

Base plate 6050 is preferably manufactured from steel for strength and minimal flexing as the load is moved from one position to another. Other materials, including metallic and non-metallic materials, may also be utilized. Base plate 6050 is supported on a framework 6100 which may be made from steel or other materials. As shown in FIG. 3, machined area 6110 may be provided along each side of the framework 6100 for precisely attaching base plate 6050 and rails 6300a,b. As shown in FIG. 5, wiring channel 6350 may be provided along the upper surface of base plate 6050 to contain electrical wiring serving the optional motors, clutches and the like.

A plurality of caster wheels 6070 are attached to framework 6100. In the illustrated embodiment, a caster wheel 6070 is attached in proximity to each of its corners. A different number and arrangement of caster wheels 6070 may alternatively be utilized. Caster wheels 6070 may be of the fixed or swiveling type according to application requirements. Other types of wheels may also be utilized. Also attached to framework 6100 are a number of extension legs with support pads 6080 to provide stability as the test head is moved throughout its motion envelope. The illustrated support pads 6080 are of the conventional type, having a round flat surface, which faces downwards, and a threaded portion, which extends upwards and engages an appropriately threaded hole in the member to which it is attached. Prior to use of manipulator system 10, leveling support pads 6080 are desirably rotated so that their flat surfaces are in contact with the floor and caster wheels 6070 are positioned slightly above the floor. Support pads 6080 may be adjusted in order to level base assembly 6000 and to place column unit 1000 in a desirably vertical position. Manipulator system 10 may be moved from one location to another across a reasonably level floor by screwing all leveling support pads 6080 inwards so that they are clear of the floor. With coaster wheels 6080 in contact with the floor, manipulator system 10 may be readily rolled to a new location.

Toothed rail 6200 is provided to facilitate in-out (forward-reverse) motion for manipulator system 10. Toothed rail 6200 is positioned between linear rails 6300a,b and extends parallel thereto. The teeth 6210 of toothed rail 6200 (see FIG. 5) are configured to engage motor driven drive gear 1115 positioned on the bottom of column unit 1000 (see FIG. 11). Horizontal drive motor 1130 (see FIG. 10) controllably rotates drive gear 1115 clockwise or counterclockwise such that drive gear 1115 engages teeth 6210 and moves column unit 1000 in or out relative to base plate 6050. With the low-friction interface between linear bearings 1110a,b,c,d and linear rails 6300a,b, significant motor torque is not required to move column unit 1000 in or out. Additionally, horizontal drive motor 1130 may be provided with a clutch mechanism which can be disengaged to allow a user to manually move column unit 1000 in or out. Horizontal drive motor 1130 preferably locks column unit 1000 relative to base assembly 6000, however, other lock mechanisms may also be provided.

Column unit 1000 will be described in more detail with reference to FIGS. 7-18. In these figures, for simplicity, column unit 1000 is generally illustrated with main arm assembly 500, roll gear box 580, cradle 300, and base unit 600 omitted therefrom.

Figure 7:
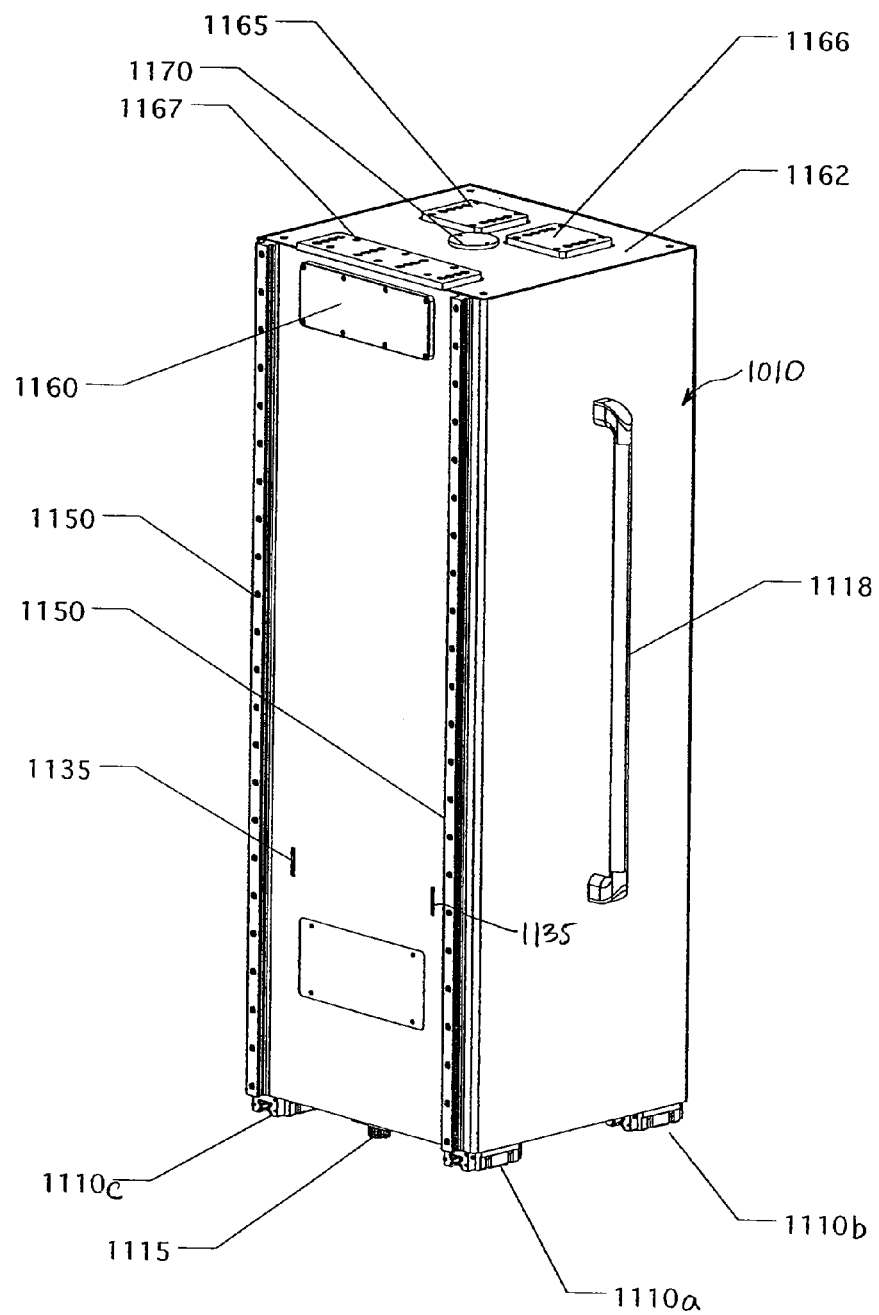
FIG. 7 is a front, right perspective view of an exemplary column unit.
Figure 8:
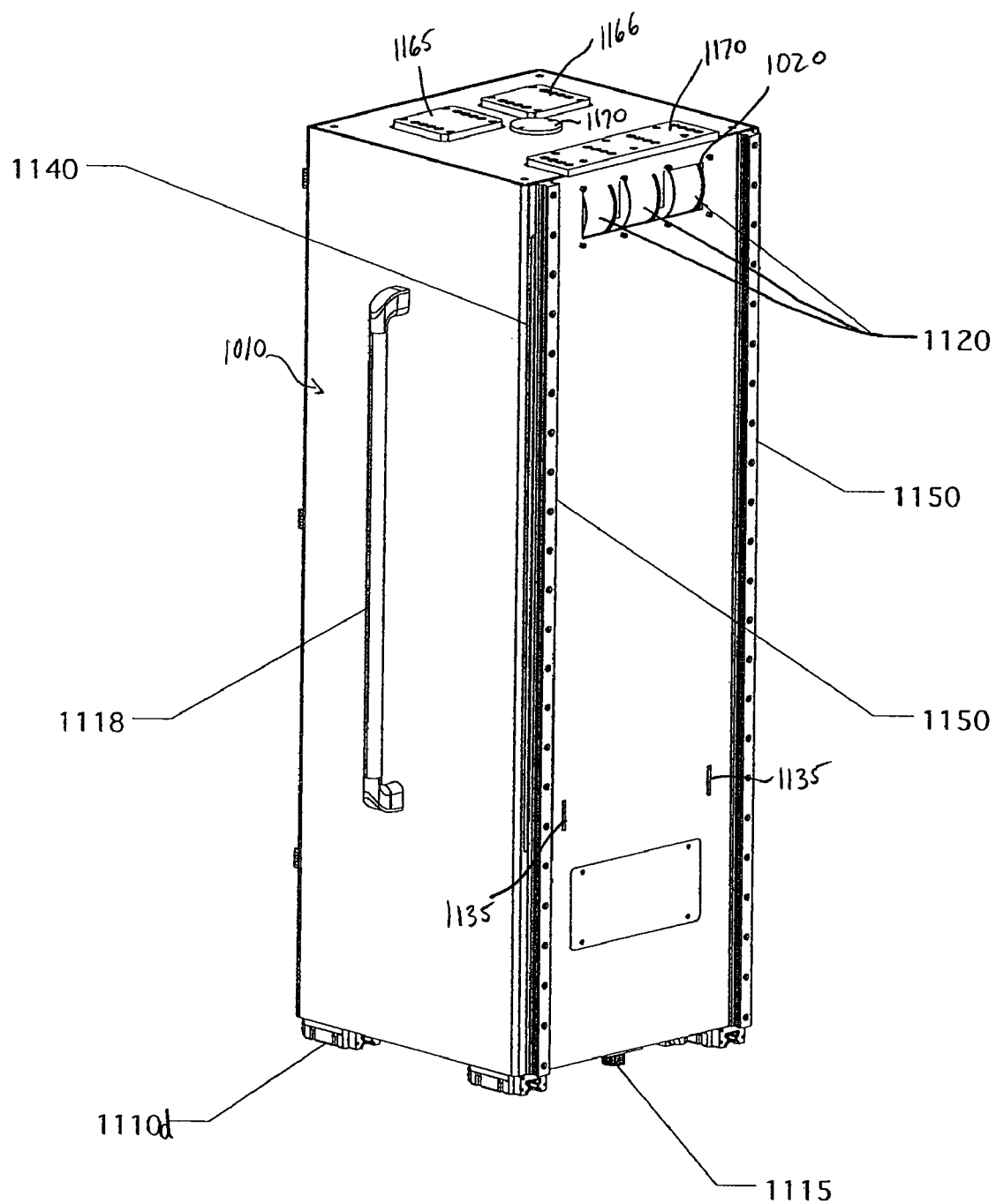
FIG. 8 is a front, left perspective view of the column unit of FIG. 7.
Figure 9:
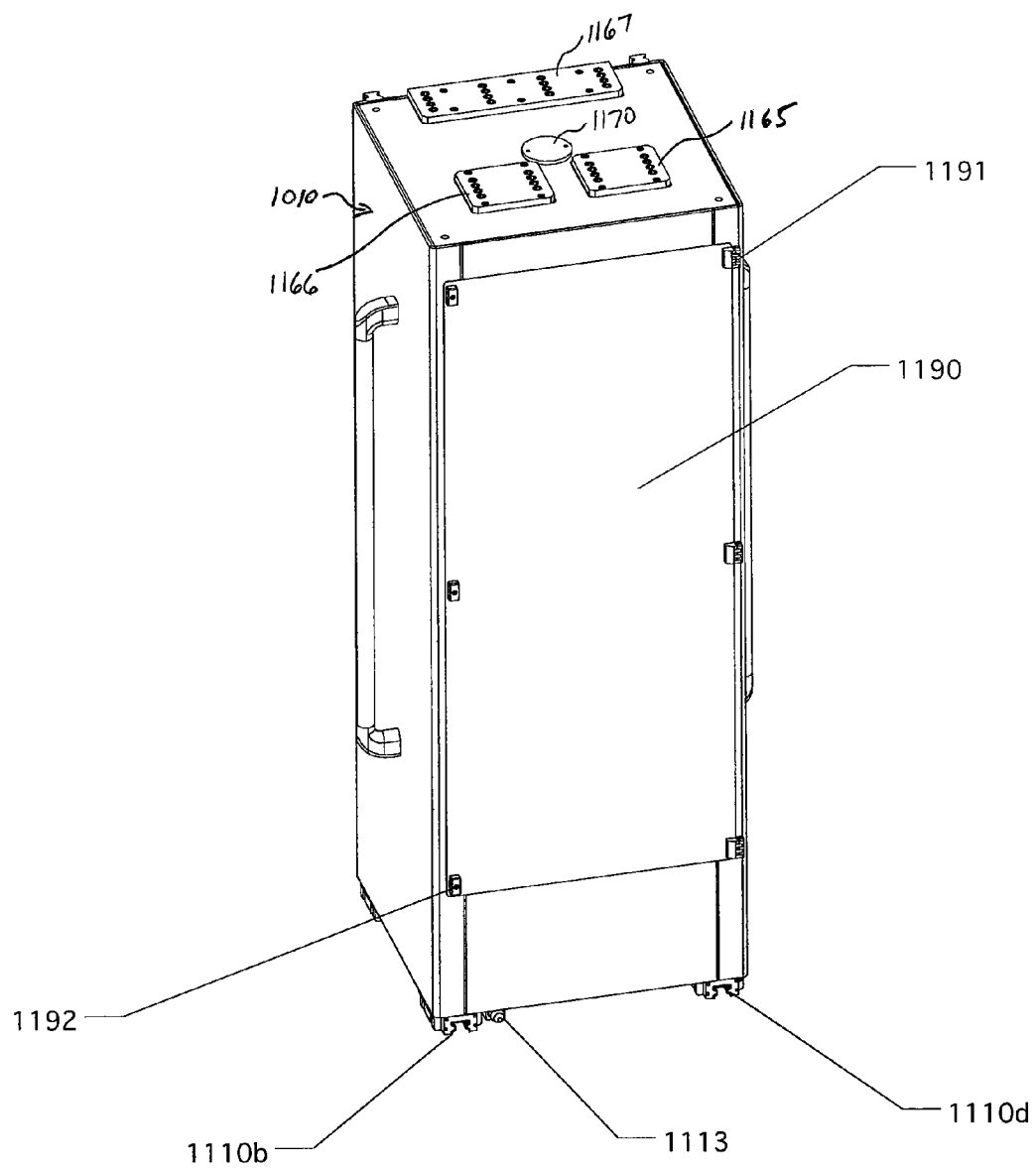
FIG. 9 is a rear perspective view of the column unit of FIG. 7 with the access door in a closed position.
Figure 10:
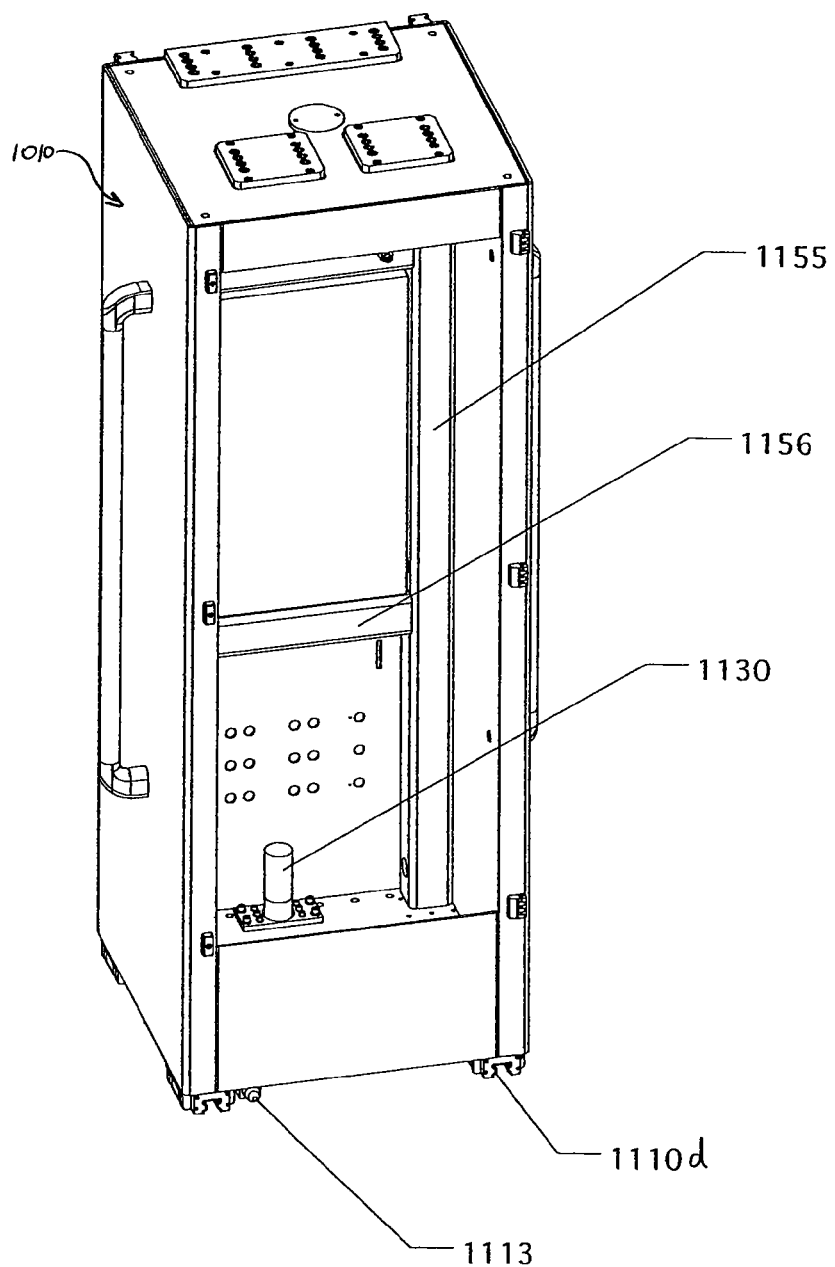
FIG. 10 is a rear perspective view of the column unit of FIG. 7 with the access door removed and the counterweight assembly and straps omitted for clarity.
Figure 11:
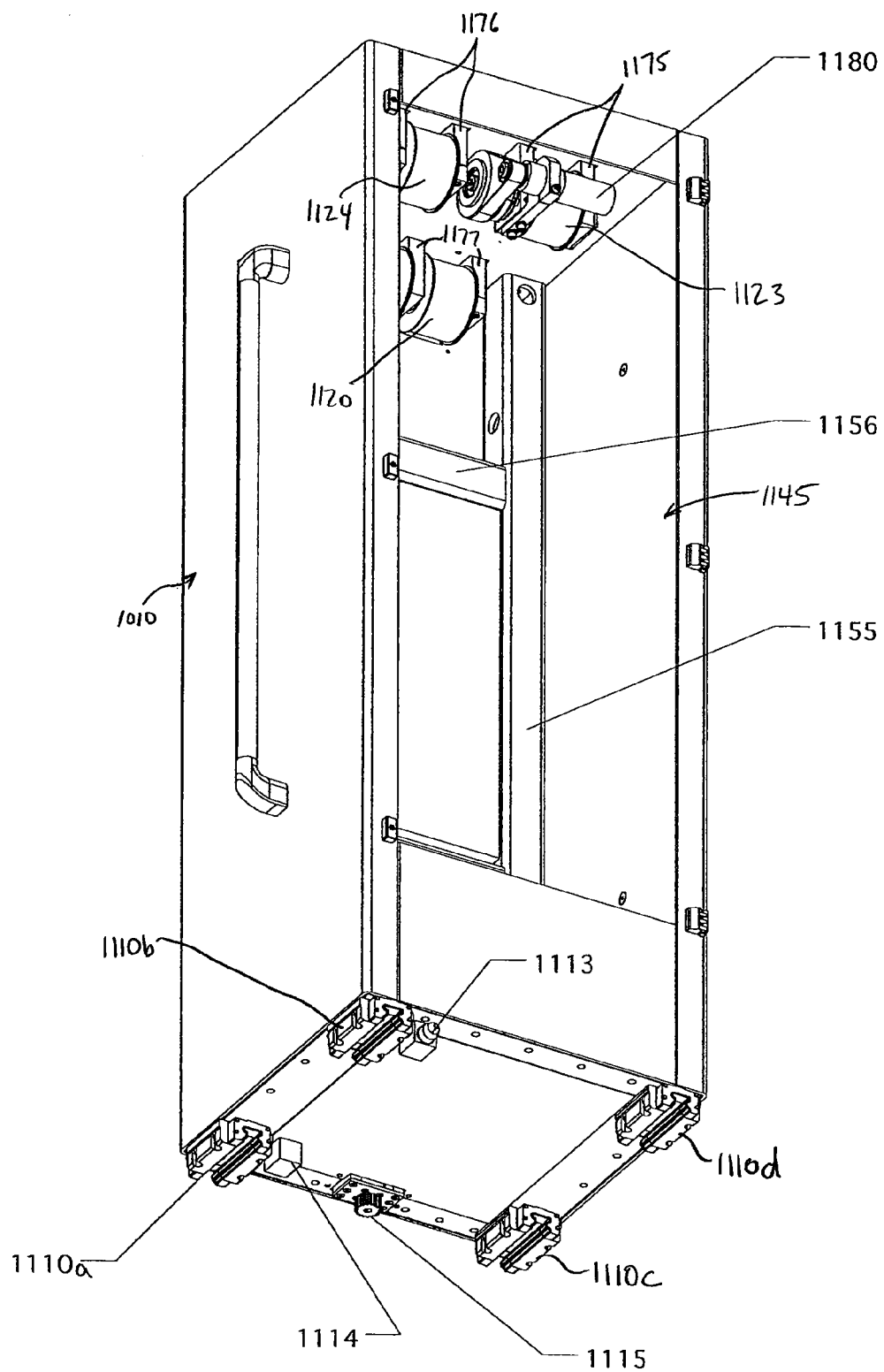
FIG. 11 is a bottom, rear perspective view of the column unit similar to FIG. 10.

Referring to FIGS. 7-11, column unit 1000 includes column body 1010, which provides a vertical support structure as well as an enclosure unit and mounting structure for various apparatus. In the present embodiment, column body 1010 is substantially U-shaped in cross section and fabricated of a suitable material, such as steel, in appropriate dimensions to support the desired load. The U-shaped cross section provides a structure with three contiguous closed sides and a substantially open back 1145. Rear access door 1190 is supported by hinges 1191 and is pivotal to a closed position as shown in FIG. 9 to substantially close column body 1010. Catches 1192 are preferably provided to maintain rear access door 1190 in the closed position. Catches 1192 can have various configurations, for example, mechanical or magnetic. As shown in FIG. 11, vertical supports 1155 and horizontal supports 1156 may be provided within column body 1010 for additional support.

Referring to FIGS. 7 and 8, one or both of the sides of column body 1010 may include a handle 1118 or the like to facilitate manual movement of the manipulator system 10. The front side of column body 1010 includes pulley opening 1020 through which pulleys 1120 extend. Cover 1160 is positioned over pulley opening 1020 to enclose pulleys 1120, but includes an open bottom such that straps 1300 (not shown in FIGS. 7 and 8) passing over pulleys 1120 may extend from column unit 1000 and attach to vertical carriage 2000, as shown in FIG. 1. Vertical linear rails 1150 extend along each side of the front side of column body 1010 and are configured to engage linear bearings 2115 on vertical carriage 2000, as described hereinafter. Magnetic tape 1140 extends parallel to one of the vertical linear rails 1150 and is used with a height sensor, as described below. One or more slots 1135 may be provided through the front surface of column body 1010 and are configured to receive the latch of a service lock, as described hereinafter.

Figure 12:
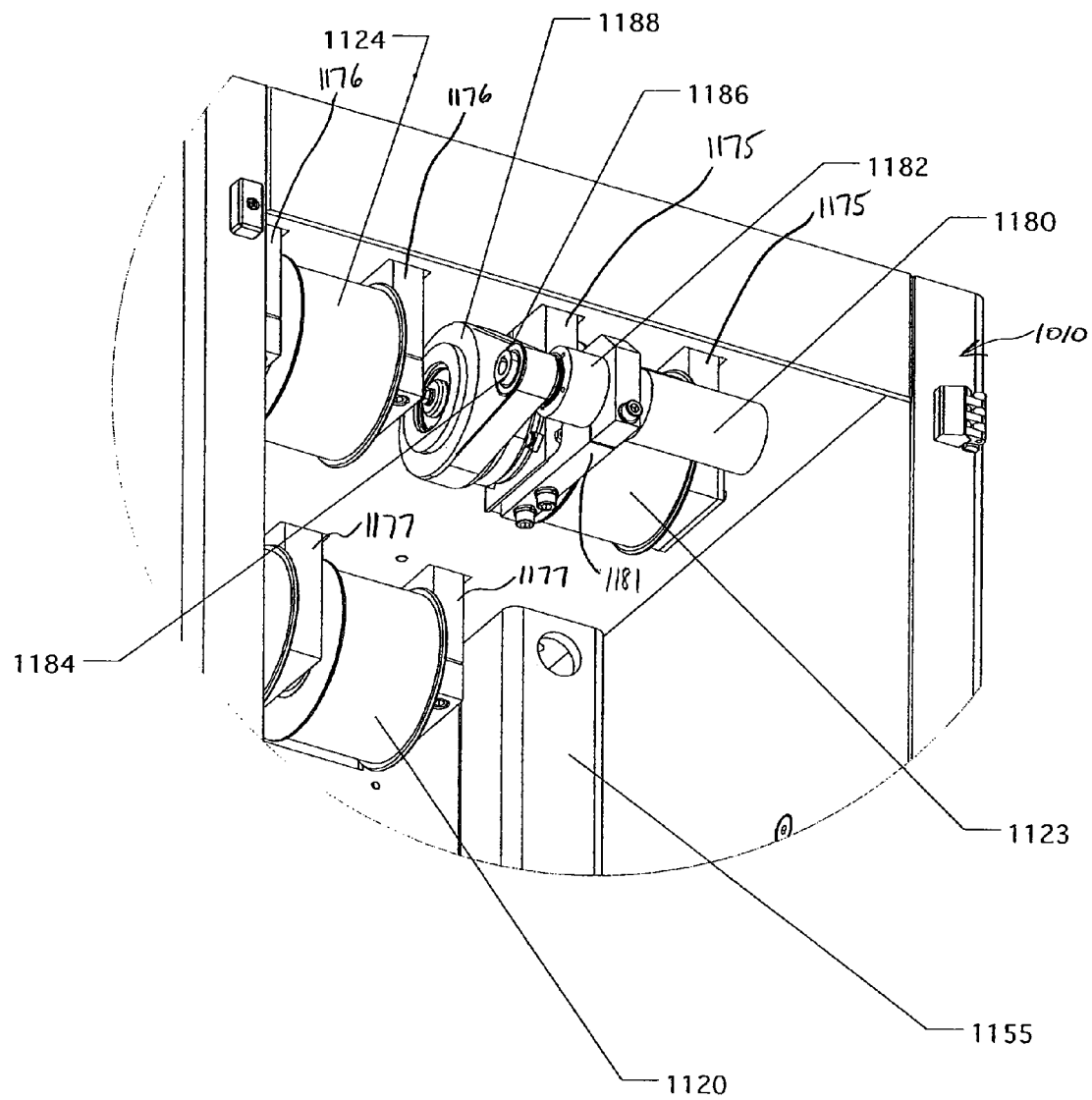
FIG. 12 is a expanded left, rear perspective view of a portion of the column unit.
Figure 13:
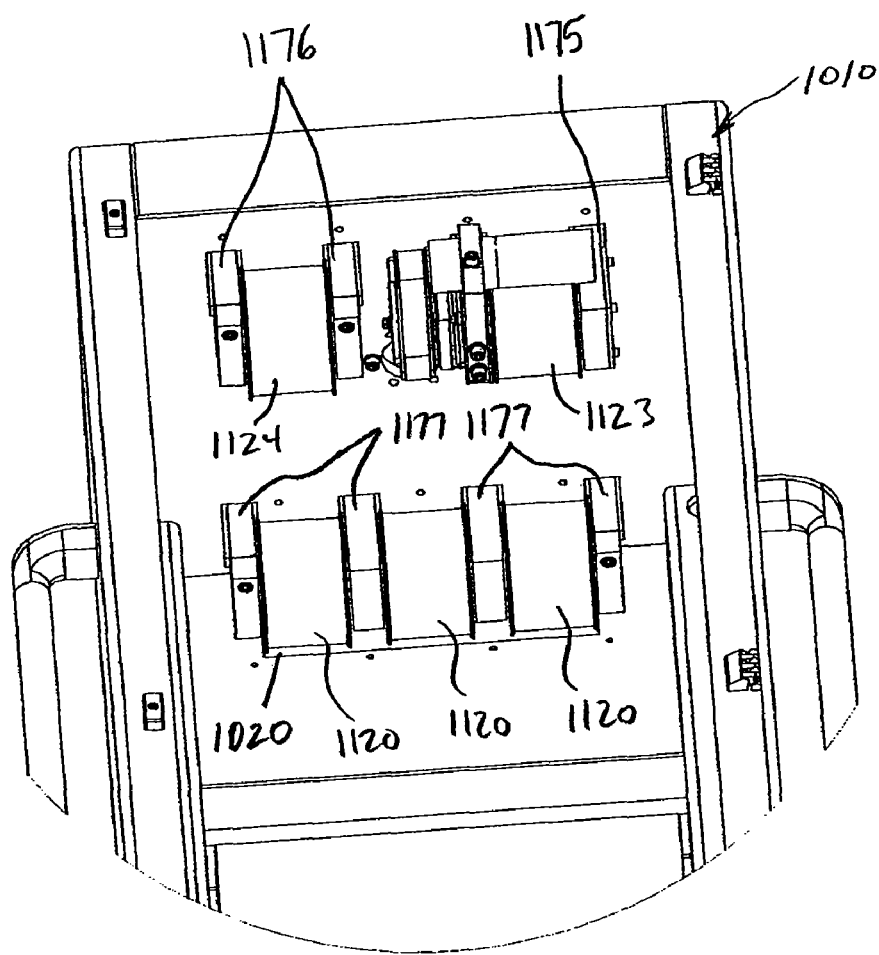
FIG. 13 is a expanded bottom, rear perspective view of a portion of the column unit.

Top plate 1162 is fitted to the top of column body 1010 and attached thereto with screws or other means. Top plate 1162 includes a plurality of openings with respective covers 1165, 1166, 1167 and 1170 positioned thereover. The opening covered by cover 1170 is provided for optional equipment, for example, an optional cable handling apparatus. Covers 1165, 1166, and 1167 are each a support cover configured to support one or more pulleys 1120, 1123, 1124. Referring to FIGS. 11-13, cover 1165 includes a pair of support blocks 1175 depending therefrom and configured to support a pulley shaft (not shown) that supports pulley 1123. This shaft also supports a second drive pulley 1188, as described below. Cover 1166 includes a pair of support blocks 1176 depending therefrom and configured to support a pulley shaft (not shown) that supports pulley 1124. Cover 1167 includes four support blocks 1177 depending therefrom and configured to support a pulley shaft (not shown) that supports pulleys 1120. Various configurations of covers and support blocks may be utilized.

Figure 14:
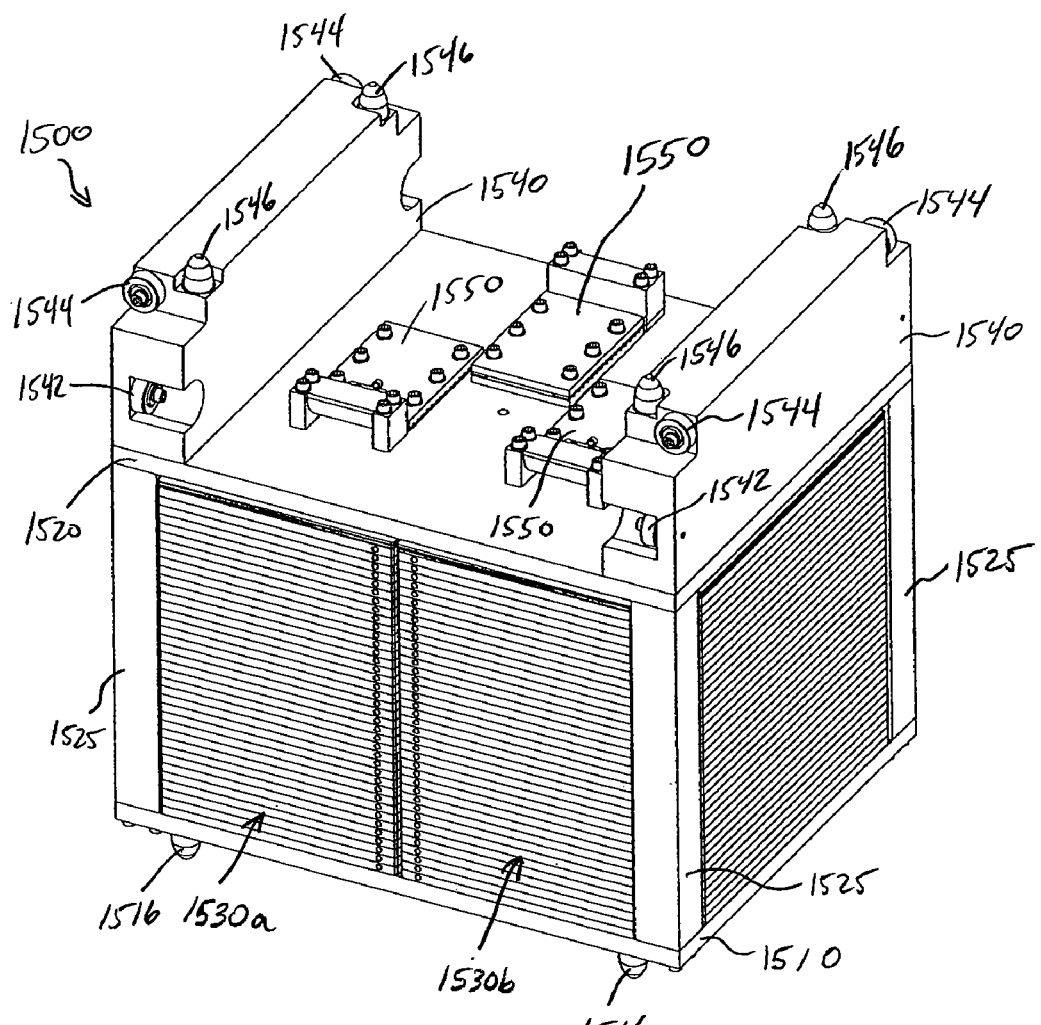
FIG. 14 is a perspective view of an exemplary counterweight assembly.
Figure 15:
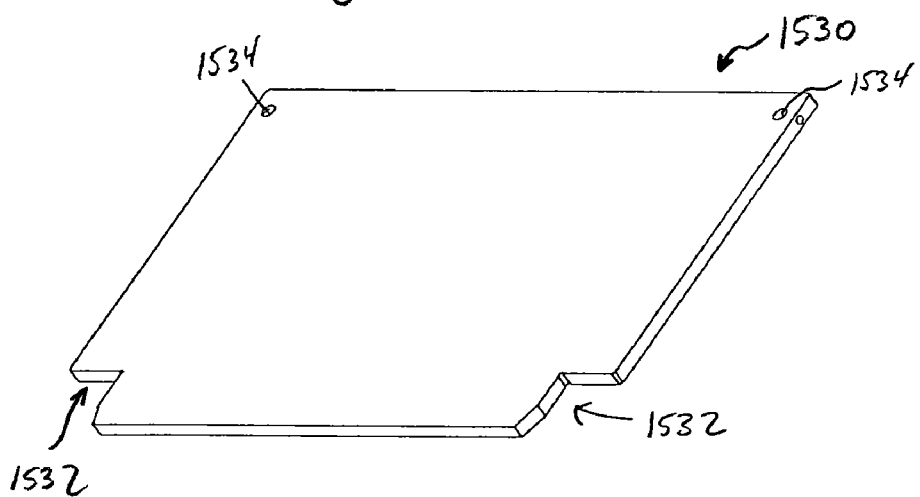
FIG. 15 is a perspective view of an exemplary weight plate.

Referring to FIGS. 1 and 11-18, pulleys 1120, 1123 and 1124 are configured to support straps 1300 extending between vertical carriage 2000 and counterweight assembly 1500. As shown in FIG. 14, counterweight assembly 1500 includes bottom plate 1510 which is attached to top plate 1520 by a plurality of vertical supports 1525. A desired number of weight plates 1530, as shown in FIG. 15, are supported between bottom and top plates 1510, 1520. In the illustrated embodiment, weight plates 1530 are provided in two stacks 1530a and 1530b. The outside edge of each weight plate 1530 includes a pair of notches 1532 to accommodate the vertical supports 1525. Each weight plate 1530 also includes a pair of rod holes 1534 for passage of a securing rod (not shown) extending between bottom and top plates 1510, 1520. The number of weight plates 1530 positioned within the counterweight assembly 1500 will vary according to the actual load.

Figure 16:
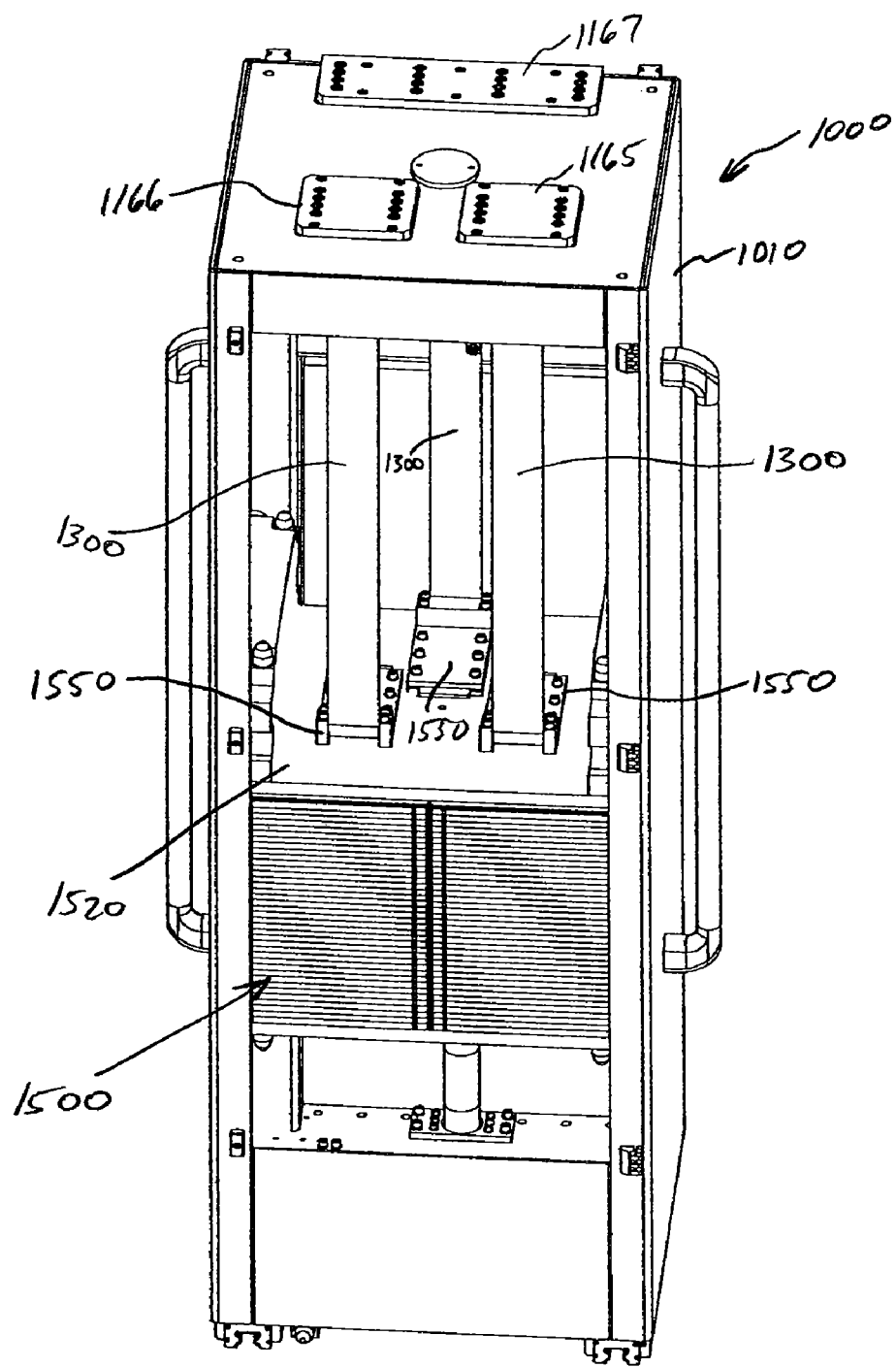
FIG. 16 is a rear perspective view similar to FIG. 10 but showing the counterweight assembly and straps.
Figure 17:
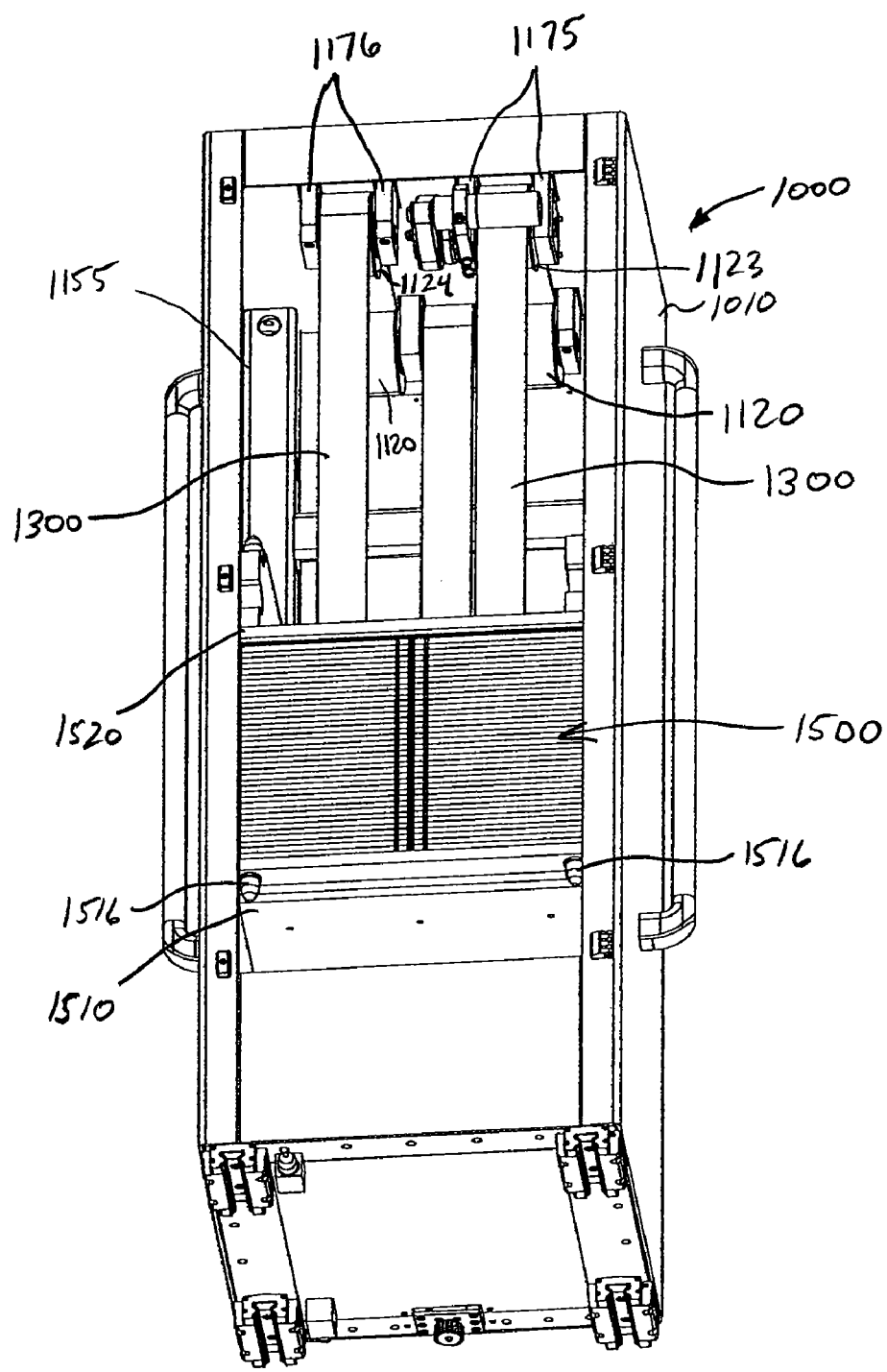
FIG. 17 is a rear perspective view similar to FIG. 11 but showing the counterweight assembly and straps.

As shown in FIGS. 16 and 17, counterweight assembly 1500 is sized to fit within column body 1010 and to travel up and down therein. To guide movement of counterweight assembly 1500, a pair of guide blocks 1540 are provided on top plate 1520. Each guide block 1540 includes a pair of front and rear guide rollers 1542 (only rear rollers 1542 shown) and a pair of side rollers 1544. Rollers 1542 and 1544 are configured to engage and roll along respective structures (e.g. vertical supports 1155) within column body 1010. Each guide block 1540 also includes a pair of elastic bumpers 1546 which cushion counterweight assembly 1500 in the event it travels to the upper limit of its range of motion. Similar elastic bumpers 1516 depend from bottom plate 1510 and cushion counterweight assembly 1500 in the event it travels to the lower limit of its range of motion.

Figure 18:
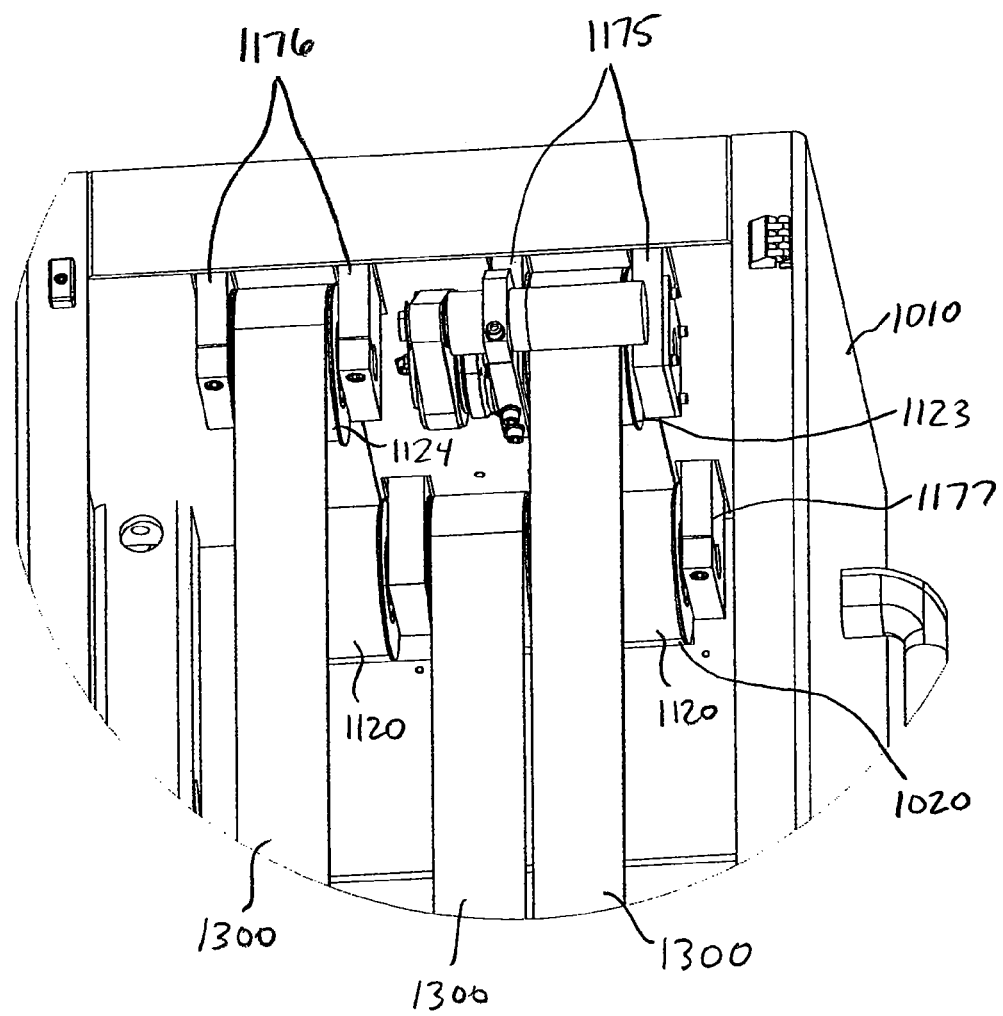
FIG. 18 is an expanded rear perspective view similar to FIG. 13 but showing the counterweight assembly and straps.

Three strap clamps 1550 are also provided on top plate 1520. Each strap clamp 1550 is configured to engage an end of a respective strap 1300 and connect such to counterweight assembly 1300. Referring to FIGS. 16-18, each strap 1300 extends from a respective strap clamp 1550 and over a pair of pulleys 1123 and 1120; 1124 and 1120 or over a single pulley 1120 and out of pulley opening 1020. Referring again to FIG. 1, each strap 1300 extends from pulley opening 1020 and is connected to vertical carriage 2000. With straps 1300 extending between vertical carriage 2000 and counterweight assembly 1500, the correct number of weight plates 1530 can be added to counterweight assembly 1500 to counterbalance the load to provide vertical compliance. Strap clamps 1550 and pulleys 1120, 1123, 1124 are preferably positioned to balance the total load, i.e. test head load, arm assembly load and counterweight load, between the straps 1300. By evenly distributing the total load, each strap 1300 only has to support ⅓ of the total load.

Figure 19:
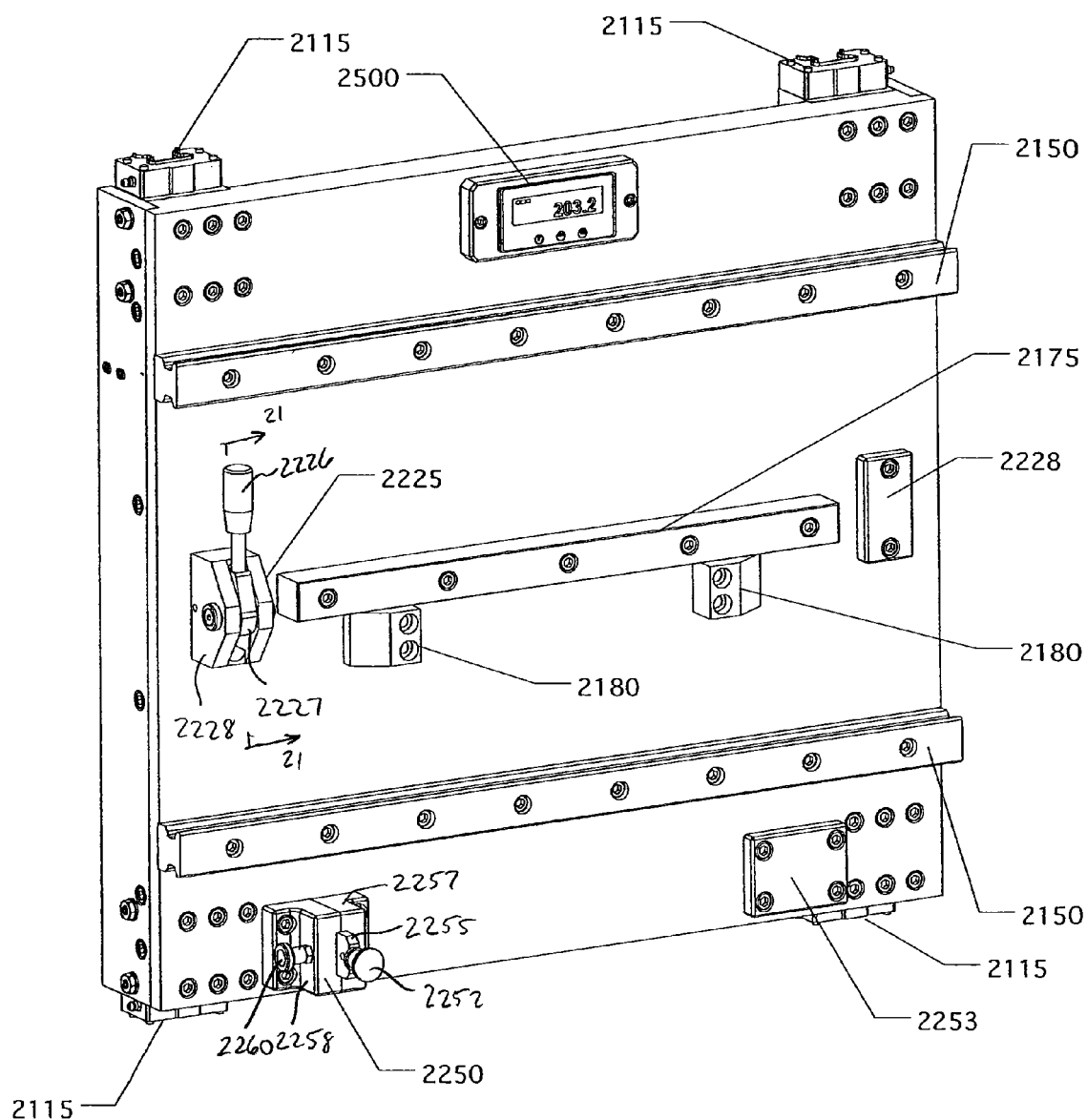
FIG. 19 is a front perspective view of an exemplary vertical carriage.
Figure 20:
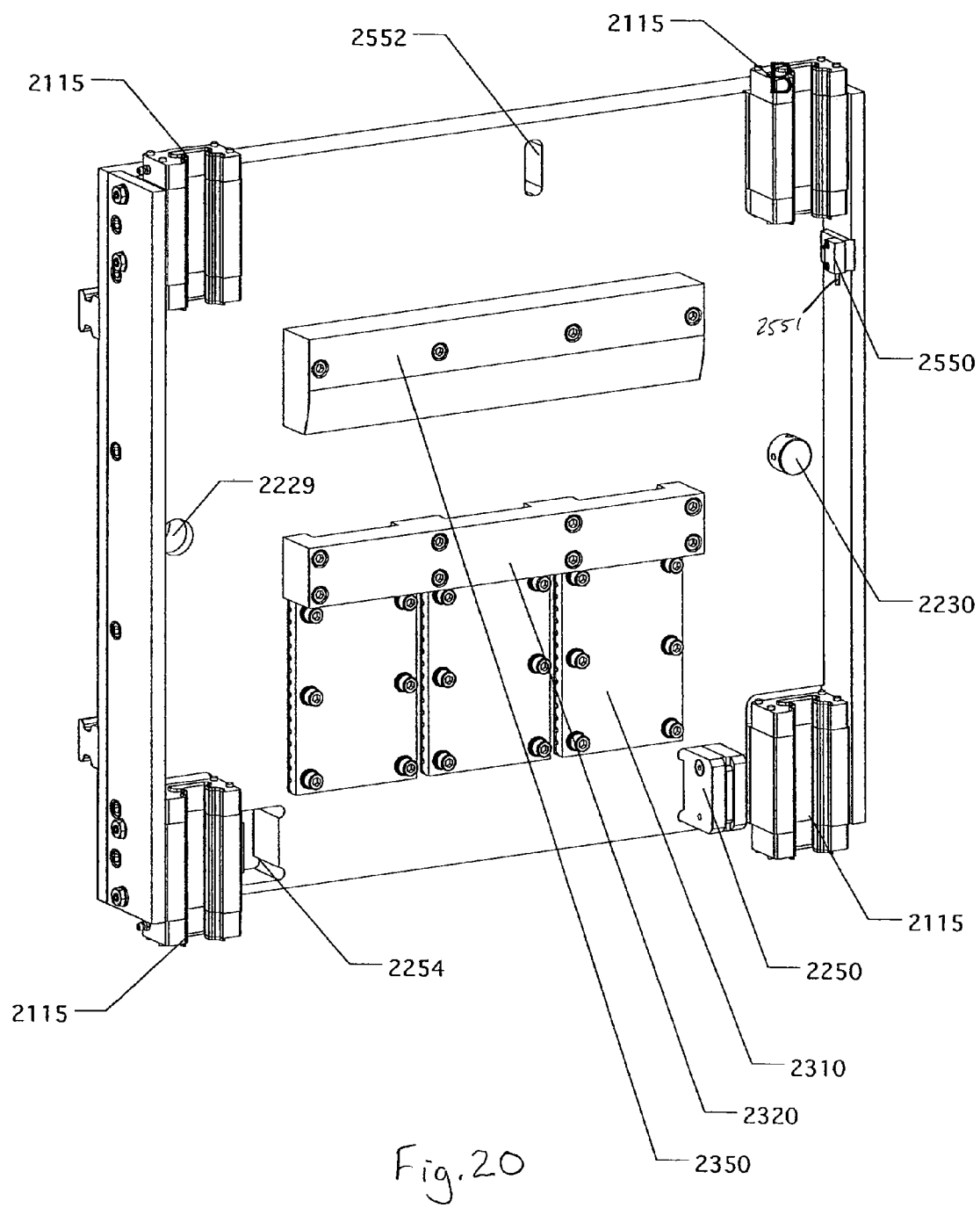
FIG. 20 is a rear perspective view of the vertical carriage of FIG. 19.

Referring to FIGS. 19-20, vertical carriage 2000 includes linear bearings 2115a,b,c and d. Linear bearings 2115a and b are arranged so as to engage one of the linear rails 1150 and linear bearings 2115c and d are arranged so as to engage the other linear rail 1150 such that vertical carriage 2000 may translate vertically with very little friction along a vertical axis defined by linear rails 1150. Vertical carriage 2000 includes a plurality of anchor plates 2310 configured to attach the ends of straps 1300 to vertical carriage 2000. Guide bracket 2320 may be provided to guide straps 1300 and maintain their orientation while alignment bracket 2350 may be provided to align straps 1300 away from and parallel with the rear surface of vertical carriage 2000, parallel with column unit 1000, and tangent to the circumference of pulleys 1120.

Referring again to FIGS. 11-13, driven vertical motion of vertical carriage 2000 will be explained. Motor mount 1181 is supported by one of support blocks 1175 and is configured to support vertical drive motor 1180 adjacent to pulley 1123. Vertical drive motor 1180 is configured to controllably drive a first drive pulley 1184. A clutch 1182 may be positioned between vertical drive motor 1180 and first drive pulley 1184 to allow first drive pulley 1182 to be disengaged from vertical drive motor 1180, for example, when manual vertical control is desired. Drive belt 1186 extends between first drive pulley 1184 and second drive pulley 1188. Second pulley 1188 and strap pulley 1123 are fixed to a common shaft. Thus, when first drive pulley 1184 is engaged with vertical drive motor 1180, the rotational output of vertical drive motor 1180 is transferred via drive belt 1186 to second drive pulley 1188, causing strap pulley 1123 to turn. Friction between strap 1300 and pulley 1123 causes the straps 1300 to move, causing the load to move up or down. Because the load is counterbalanced, in equilibrium, and in an essentially weightless state, little power is required. Vertical drive motor 1180 is geared down appropriately and pulleys 1184 and 1188 are sized appropriately to provide a desired speed. When it is desired to move the load manually or by some other external force, clutch 1182 may be disengaged so that the external force does not have to overcome back-driving the reduction gear mechanism.

Referring again to FIGS. 19 and 20, additional features of vertical carriage 2000 will be described. Vertical position display 2500 is provided on the front face of vertical carriage 2000. In the preferred embodiment, vertical position display 2500 is a battery operated unit that provides a digital readout of the present vertical position of vertical carriage 2000. Other types of displays, including mechanical displays, may also be utilized. In the present embodiment, magnetic sensor 2550 is electrically connected with vertical position display 2500 via wires 2551 (only a portion shown in FIG. 20) or any other transmission means, including wireless transmissions. Magnetic sensor 2550 is aligned with magnetic tape 1140 extending vertically along column unit 1000 as described above. As magnetic sensor 2550 is passed along magnetically coded tape 1140, vertical position display 2500 calculates and displays the position. While the position is calculated by display 2500 in the present embodiment, it may alternatively be calculated within sensor 2550 or otherwise calculated. Vertical position display 2550 provides the operator with a digital readout of the load's vertical position. A suitable system of the display 2500, sensor 2550 and tape 1140 is provided by ELGO Electric GmbH, Rielasingen, Germany under the product identifier "Z-17 Series" battery powered length measuring system. The height indicator is not limited to the specific embodiment described herein and may be implemented with any suitable linear position sensing and display apparatus.

It is furthermore anticipated that equivalent sensor/display apparatus may be adapted to provide read-outs of the positions of other axes, including for example: the in-out position of column 1000 with respect to base 6000, the horizontal position of main arm 5000 with respect to vertical carriage 2000, and the angle of roll rotation of roll unit 5800. Adaptation of the technique to such axes should be straightforward for one of ordinary skill in the art.

Figure 21:
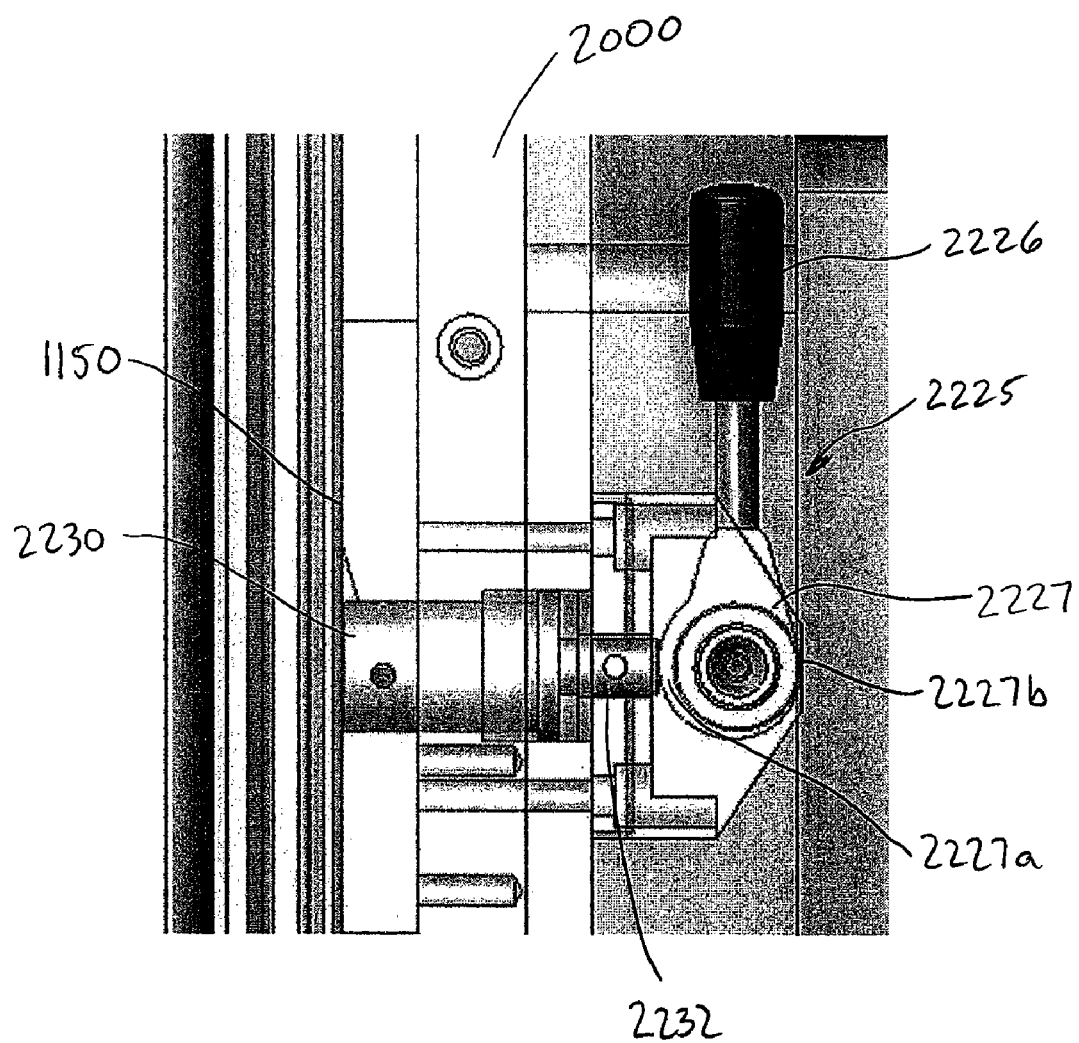
FIG. 21 is a cross-sectional view along the line 21-21 in FIG. 19.

With reference to FIGS. 19-21, vertical carriage 2000 includes vertical lock unit 2225 configured to lock the vertical position of vertical carriage 2000 upon actuation thereof. Mounting block 2228 on the front face of vertical carriage 2000 supports handle 2226 for pivotal motion between a locked position and an unlocked position. Handle 2226 terminates in cam surface 2227 having a radially extending portion 2227a and a radially blunted portion 2227b approximately 180° therefrom. When handle 2226 is in the locked position shown in FIGS. 19 and 21, radially extending portion 2227a of cam surface 2227 engages lock shaft 2232 and forces shaft 2232 axially toward linear rail 1150. With lock shaft 2232 moved axially toward linear rail 1150, vertical foot pad 2230 at the end thereof engages linear rail 1150 and causes a frictional lock therewith. When handle 2226 is rotated 180°, radially blunted portion 2227b aligns with lock shaft 2232 and the axial load is removed from vertical foot pad 2230 and the brake is released. Foot pad 2230 may be spring loaded so that it automatically retracts when the lock is released. FIG. 20 illustrates a through hole 2229 which may be utilized as an alternative location for vertical lock unit 2225. As shown in FIG. 19, cover 2228 is preferably positioned over through hole 2229 when not in use.

Because the load is normally balanced, a friction lock is generally sufficient to hold it in position. As described below, a service lock is also provided for special service or maintenance situations when the load may be unbalanced.

Figure 22:
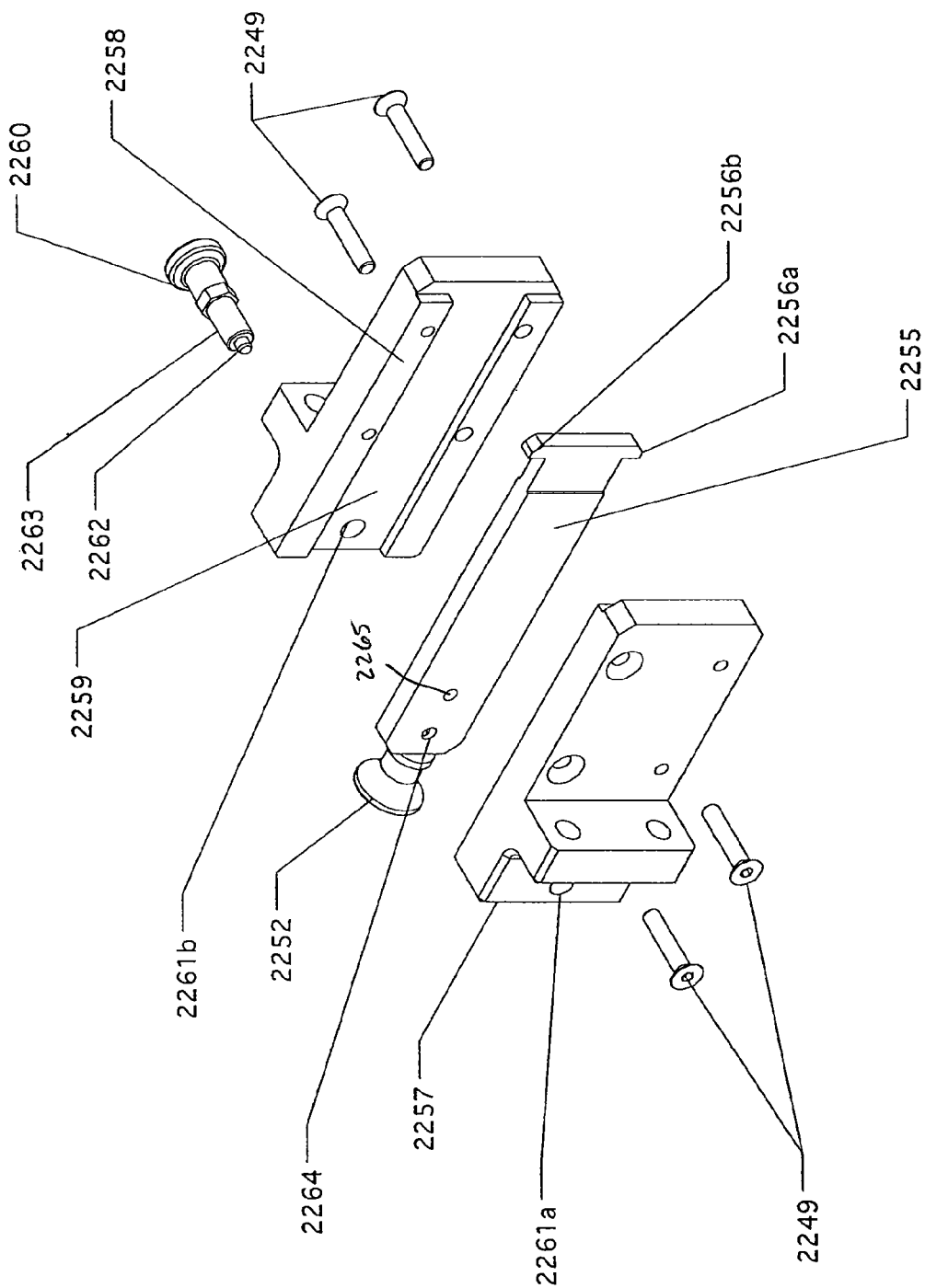
FIG. 22 is an exploded perspective view of an exemplary safety service lock.

With reference to FIGS. 19, 20 and 22, safety service lock 2250 will be described. Safety service lock 2250 is provided to secure the load at a particular service vertical height when being serviced. Service often frequently involves changing the weight of the test head, which can put the system undesirably out of balance. It is desirable to maintain the vertical position securely while the system is unbalanced. It is further desirable to make sure the load remains vertically locked until balance is restored by appropriately adjusting the weight of the counterweights.

Referring to FIG. 22, an embodiment of safety service lock 2250 is shown. Safety service lock 2250 includes tang 2255 which is slidably positioned within groove 2259 defined by opposed lock blocks 2257 and 2258. Screws 2249 or the like secure the two lock blocks 2257, 2258 together. One end of tang 2255 terminates in operator handle 2252 and the other end terminates in opposed hooks 2256a, b. A pair of spaced apart position holes 2264 and 2265 extend through tang 2255 proximate to the handle end thereof. A threaded hole 2261a, 2261b is provided in each lock block 2257, 2258, respectively, and is configured to threadably receive screw 2260. In operation, screw 2260 will be positioned in only one of the holes 2261a, b; however, screw 2260 may be used in either block 2257, 2258, whichever is most convenient. Screw 2260 includes a threaded portion 2263 configured to engage a desired threaded hole 2261a, b and a tip portion 2262 configured to engage a desired position hole 2264, 2265. FIG. 20 illustrates a through hole 2254 which may be utilized as an alternative location for service safety lock 2250. As shown in FIG. 19, cover 2253 is preferably positioned over through hole 2254 when not in use.

Figure 23:
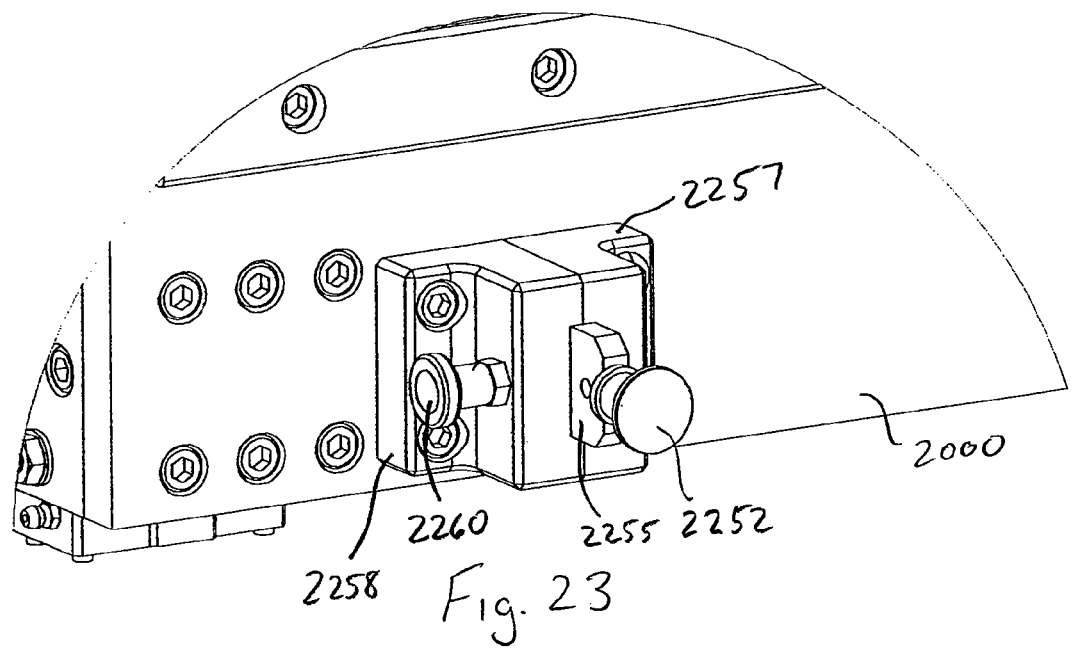
FIGS. 23 and 24 are front and rear partial perspective views illustrating the safety service lock in an unlocked condition.
Figure 24:
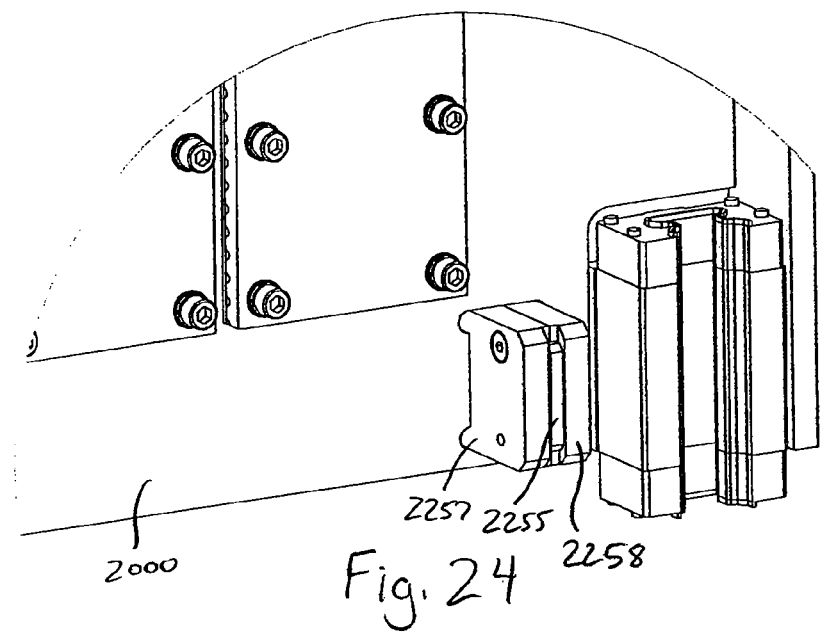
Figure 25:
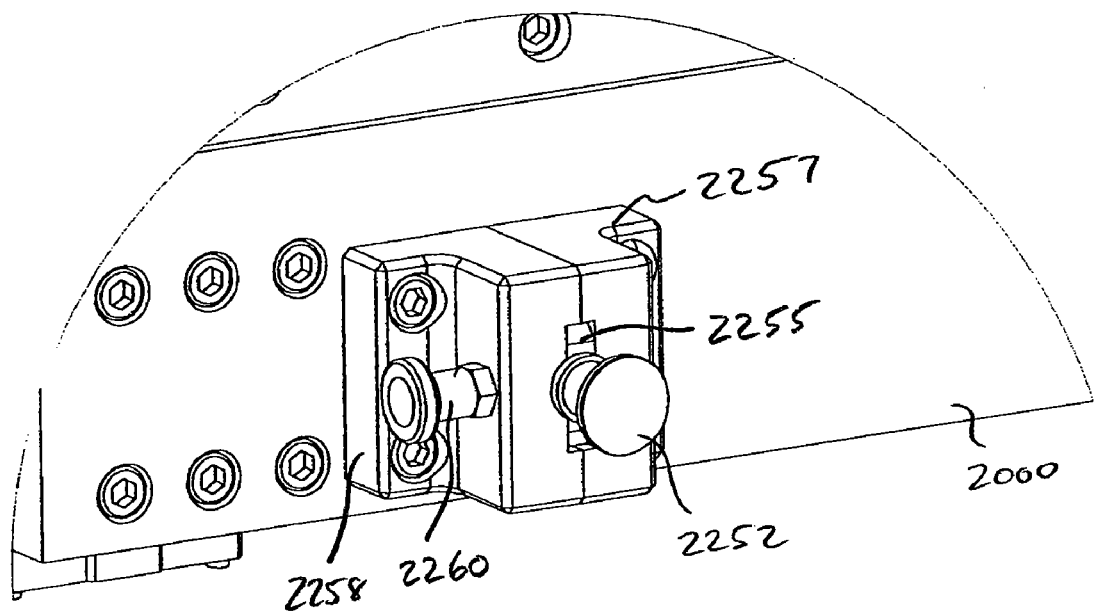
FIGS. 25 and 26 are front and rear partial perspective views illustrating the safety service lock in a locked condition.
Figure 26:
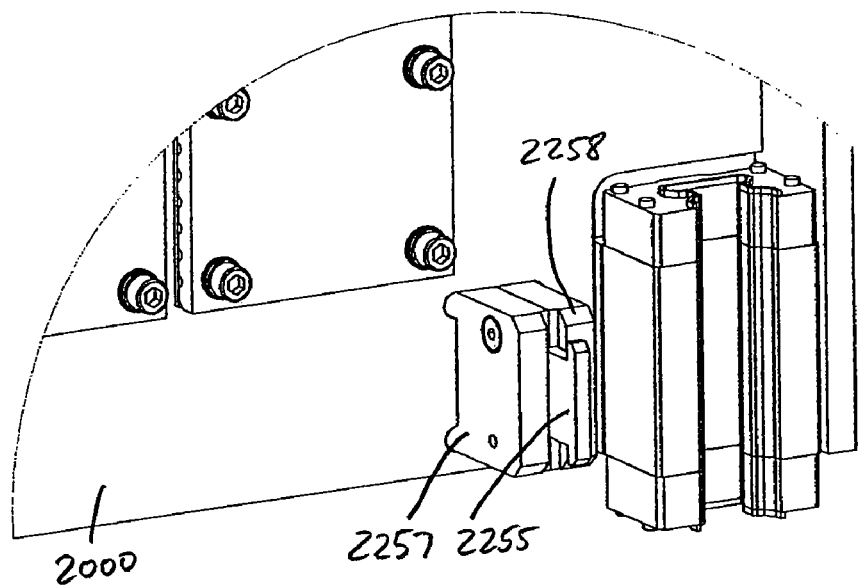

Service safety lock 2250 extends through vertical carriage 2000 and is configured to interact with slot 1135 in column body 1010. The service position is where tang 2255 of lock 2250 is at a height that is aligned with slot 1135. The service position may easily be found and maneuvered to by an operator with the assistance of the precise position indicator described above. In normal operation (unlocked condition) as illustrated in FIGS. 23 and 24, tang 2255 is held in a retracted position by screw tip 2262 engaging position hole 2265. To lock vertical carriage 2000 at the service position, screw 2260 may be unscrewed by rotating its attached knob, thus retracting tip 2262. Tang 2255 may then be inserted into slot 1135 by pushing on handle 2252 such that tang 2255 projects from blocks 2257 and 2258, as illustrated in FIGS. 25 and 26. Screw 2260 may then be retightened such that tip 2262 engages position hole 2264. If the system becomes unbalanced when in the locked service position, vertical carriage 2000 moves slightly, upwards or downwards, depending upon the direction of the imbalance. The interaction of tang 2255 with slot 1135 prevents motion of more than a few millimeters, and either hook 2256a or hook 2256b will become hooked behind the slot 1135. In this condition, it is not possible to retract tang 2255. This prevents any sudden and potentially large motions of the load if it becomes unbalanced in the locked service position. Further, tang 2255 can not be withdrawn from slot 1135 by pulling on handle 2252 until the load has become properly balanced or rebalanced. Also, the service position may be designed into an individual system for a specific application by appropriately locating slot 1135. Additionally, a system could have a number of service positions by incorporating a number of slots 1135.

As shown in FIG. 19, the front surface of vertical carriage 2000 includes a pair of spaced apart horizontal linear rails 2150 with horizontal lock rail 2175 therebetween. Horizontal linear rails 2150 are configured to support main arm plate 5100 of arm assembly 5000. Stop blocks 2180 are positioned on vertical carriage 2000 to limit the horizontal range of motion of main arm plate 5100.

Figure 28:
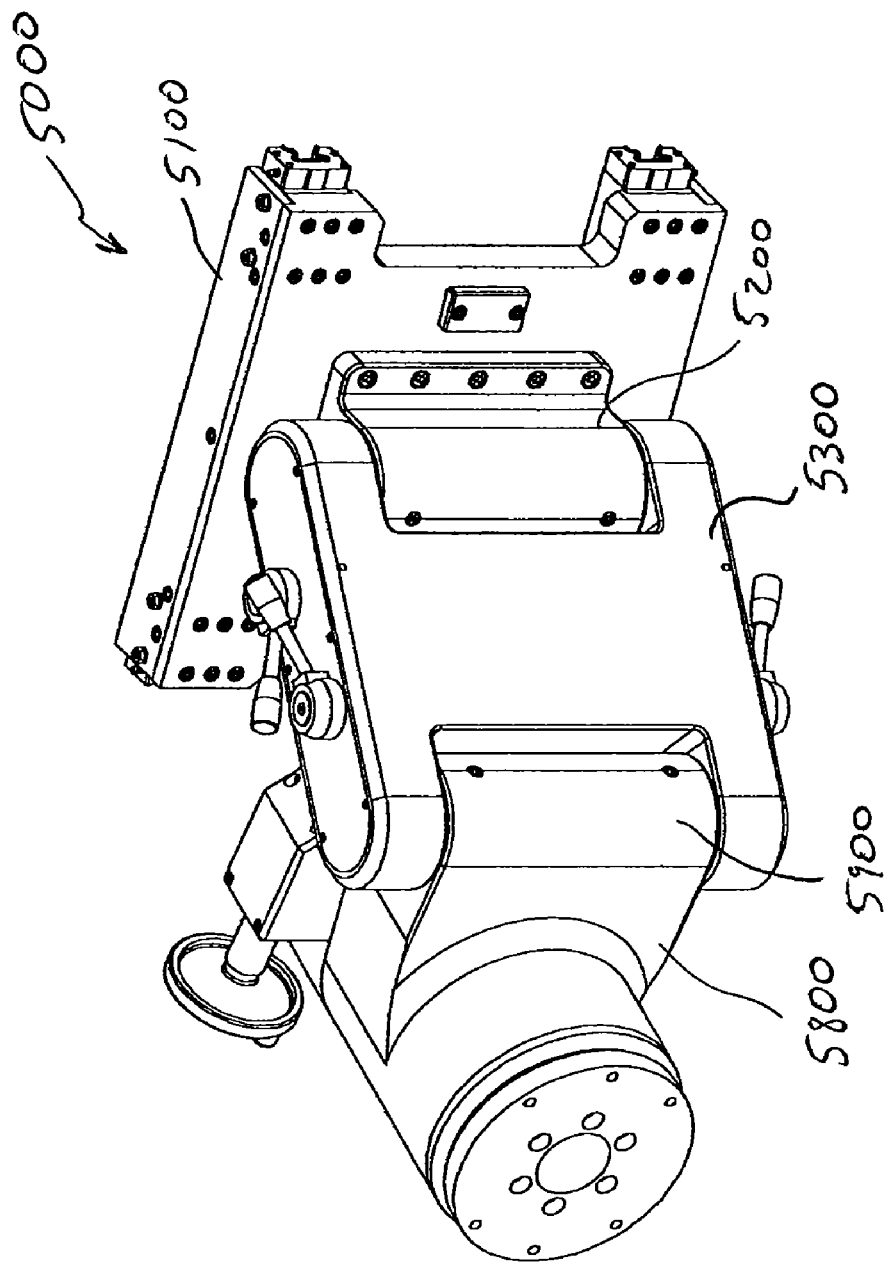
FIG. 28 is an assembled perspective view of the arm assembly of FIG. 27.

FIGS. 27 and 28 illustrate the components of arm assembly 5000. Arm assembly 5000 generally comprises main arm plate 5100, upper arm assembly 5300 and roll gear box assembly 5800. Bearing block 5200 extends from the front surface of main arm plate 5100 and pivotally supports pivot axel 5210. Pivot axel 5210 has an upper portion 5210a and a lower portion 5210b. Pivot axel 5210 is configured to pivotally support upper arm assembly 5300 and defines a first vertical pivot axis for arm assembly 5000. Roll gear box assembly 5800 includes bearing block 5900 that pivotally supports pivot axel 5910. Pivot axel 5910 has an upper portion 5210a and a lower portion 5210b. Pivot axel 5910 is configured to be pivotally supported by upper arm assembly 5300 and defines a second vertical pivot axis for arm assembly 5000.

Figure 29:
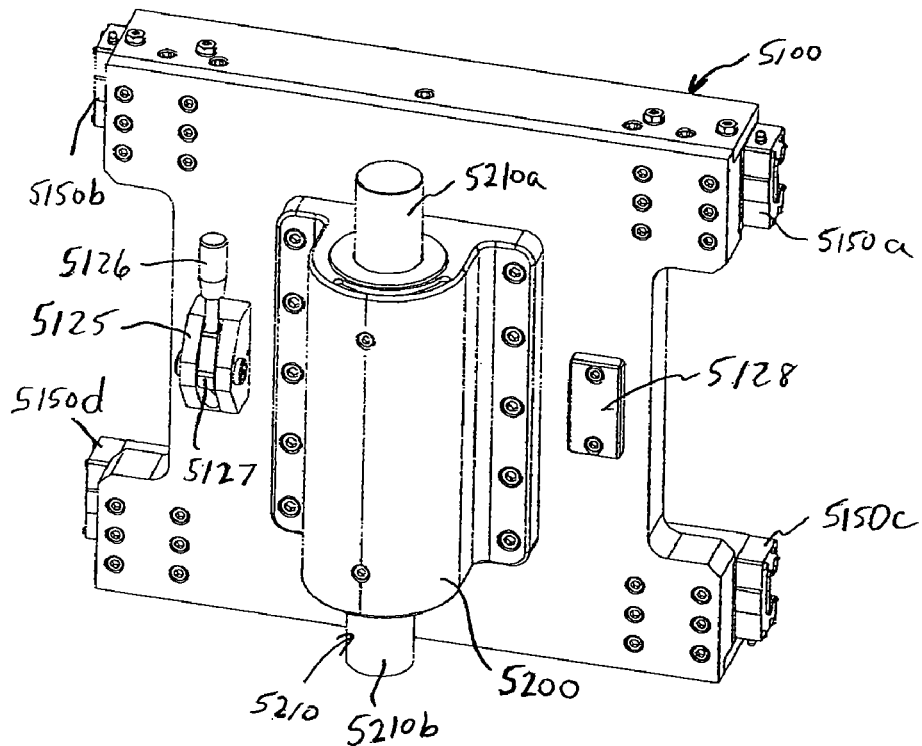
FIG. 29 is a front perspective view of an exemplary main arm plate.
Figure 30:
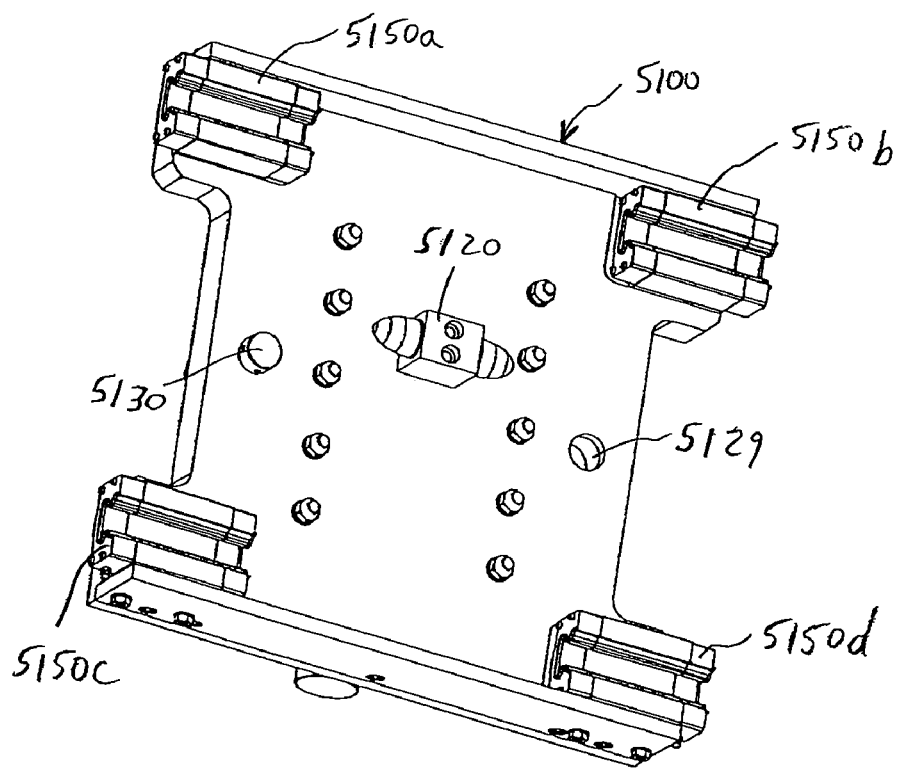
FIG. 30 is a rear perspective view of the main arm plate of FIG. 29.
Figure 31:
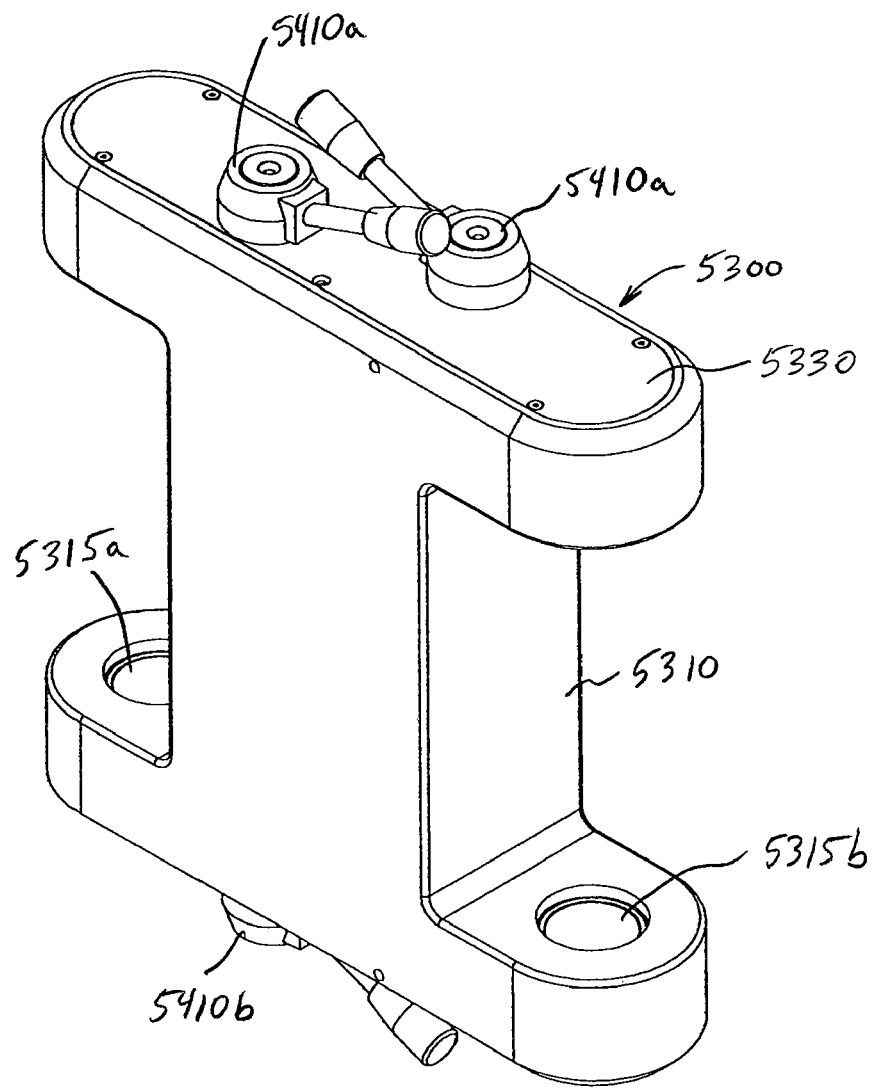
FIG. 31 is a perspective view of an exemplary upper arm assembly.

Referring to FIGS. 29 and 30, main arm plate 5100 will be described in more detail. Main arm plate 5100 includes linear bearings 5150a,b,c and d. Linear bearings 5150a and b are arranged so as to engage one of the linear rails 2150 and linear bearings 5150c and d are arranged so as to engage the other linear rail 2150 such that main arm plate 5100 may translate horizontally with very little friction along a horizontal axis defined by linear rails 2150. Stop block 5120 on the rear surface of main arm plate 5100 is configured to engage stop blocks 2180 on vertical carriage 2000. Horizontal lock unit 5125 extends through main arm plate 5100 to facilitate locking of the horizontal position of main arm plate 5100. Horizontal lock unit 5125 is substantially the same as lock unit 2225 and includes handle 5126 with cam surface 5127. Handle 5126 pivots between locked and unlocked positions such that horizontal lock pad 5130 is engaged or disengaged from horizontal lock rail 2175. FIG. 30 illustrates a through hole 5129 which may be utilized as an alternative location for horizontal lock unit 5150. As shown in FIG. 29, cover 5128 is preferably positioned over through hole 5129 when not in use.

Upper arm assembly 5300 will be described with reference to FIGS. 31-34. Upper arm assembly 5300 includes I-shaped upper arm block 5310. Lower bearing 5315a and upper bearing 5320a (see FIG. 33) are defined on one side of upper arm block 5310 and are configured to pivotally support the lower portion 5210b and upper portion 5210a, respectively, of pivot axel 5210. The opposite side of upper arm block 5310 includes lower bearing 5315b and upper bearing 5320b (see FIG. 33) configured to pivotally support lower portion 5910b and upper portion 5910a, respectively, of pivot axel 5910 of roll gear box assembly 5800.

Figure 32:
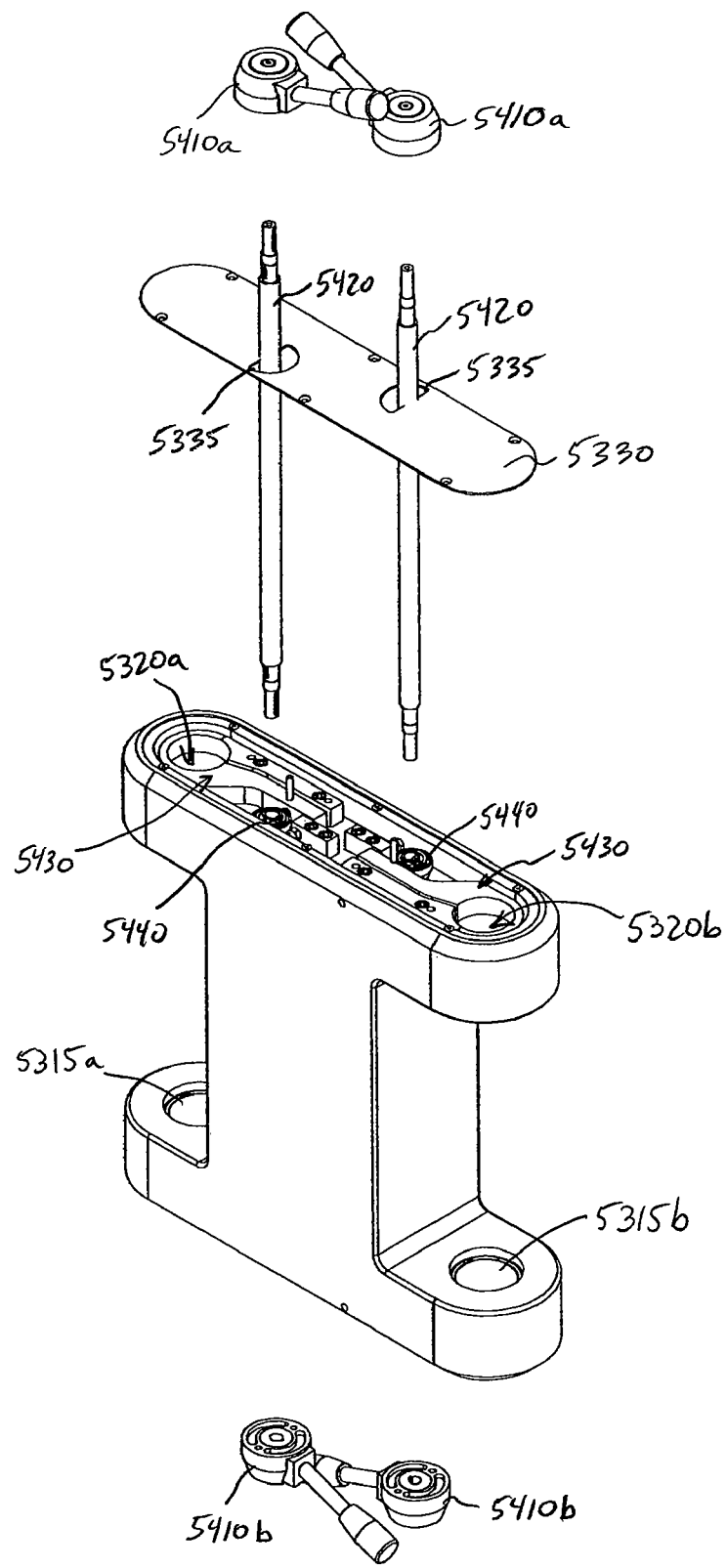
FIG. 32 is a partially exploded view of the upper arm assembly of FIG. 31.

A lock assembly 5400 is positioned in each half of upper arm block 5310 and is configured to rotationally lock the position of the associated pivot axel 5210 or 5910. The lock assemblies 5400 are preferably symmetrical and are numbered the same herein. As shown in FIG. 32, each lock assembly 5400 includes connector rod 5420 extending through a respective hole 5335 in cover 5330 between upper handle 5410a and lower handle 5410b. Connector rod 5420 is keyed to both handles 5410a,b and therefore will rotate with rotation of either handle 5410a,b. Only a single handle may be provided, however, having two handles 5410a,b provides greater user accessibility depending on the height of the arm assembly 5000.

Figure 33:
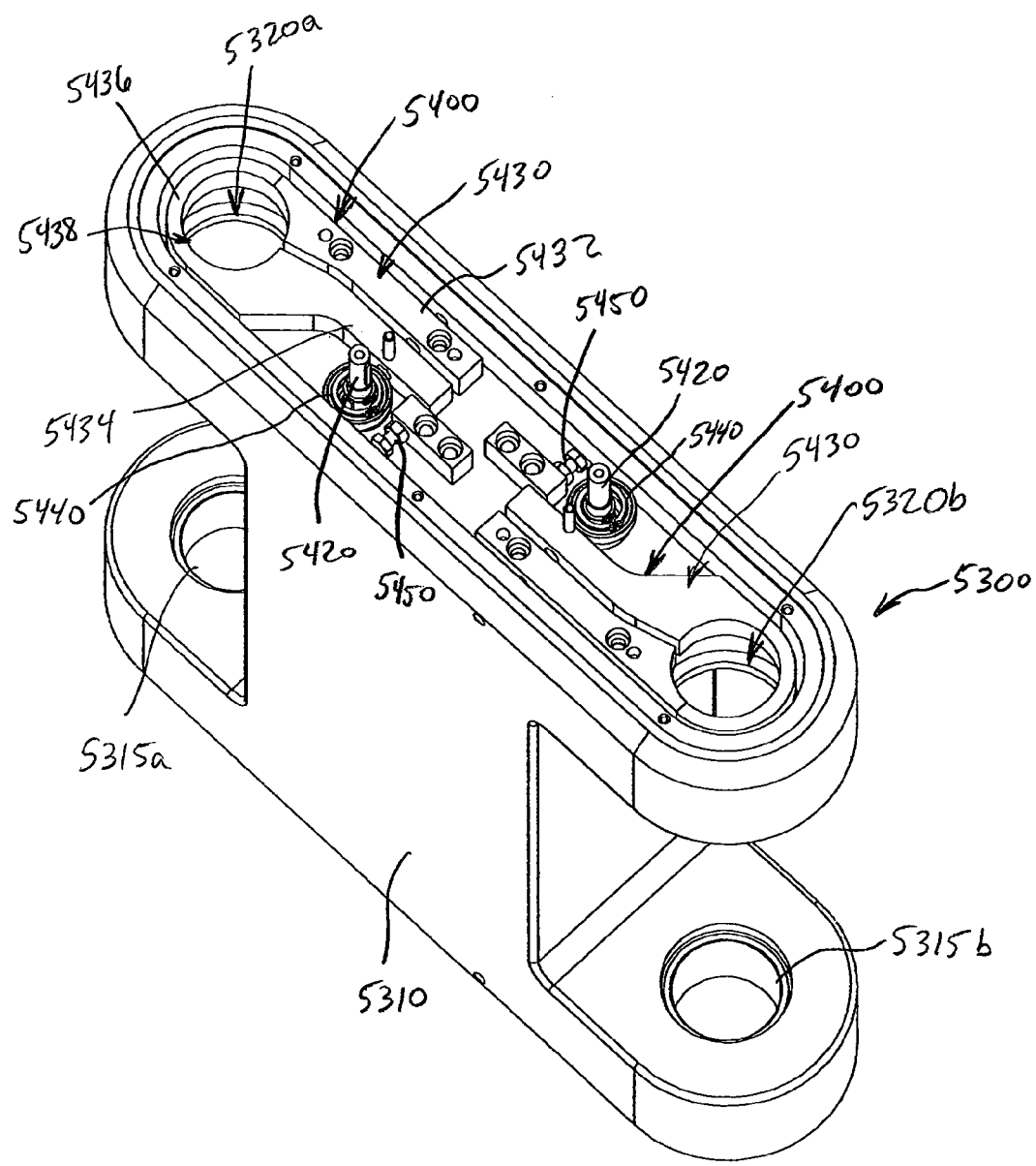
FIG. 33 is a top perspective view of the upper arm assembly of FIG. 31 with its cover removed.
Figure 34:
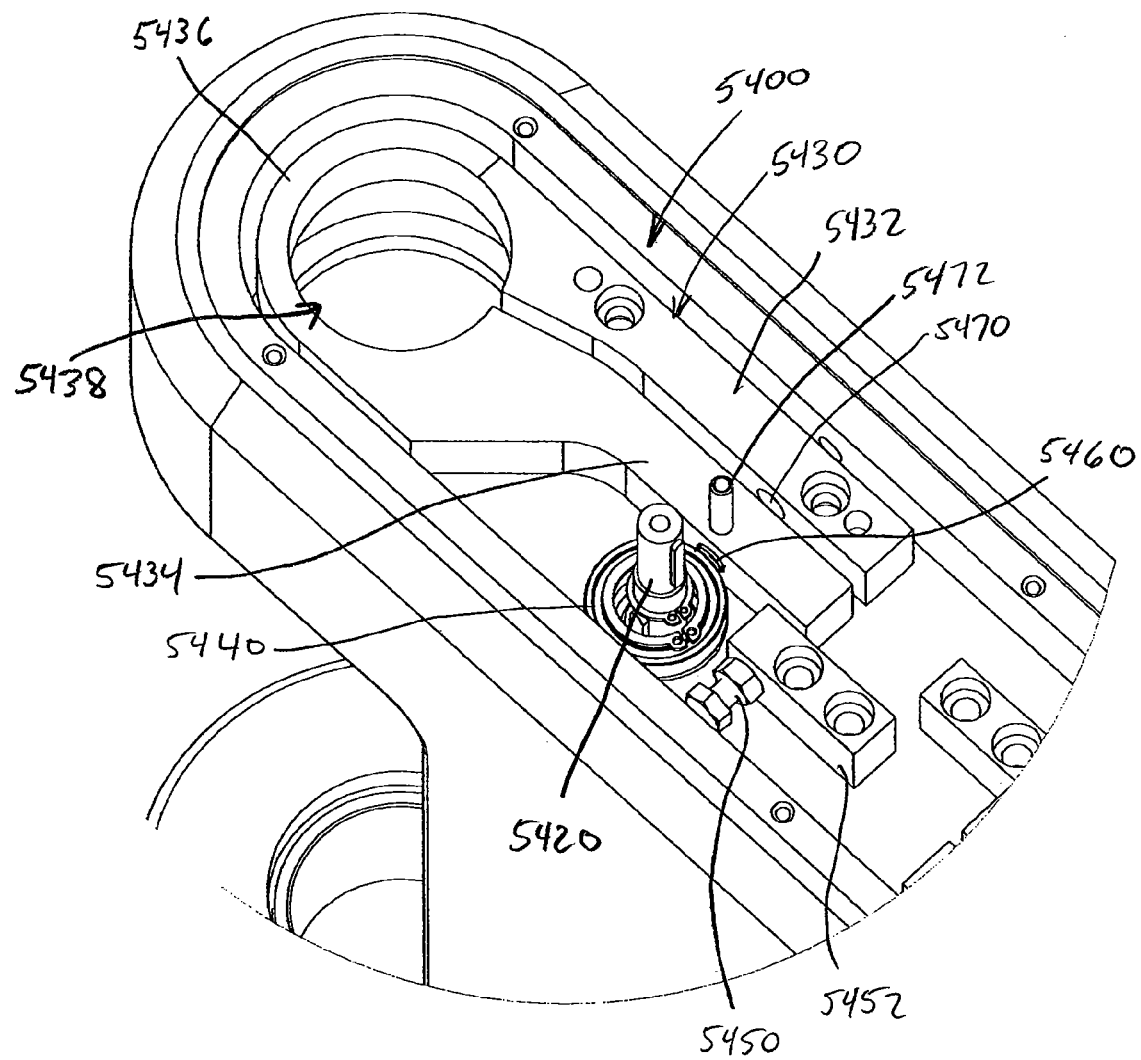
FIG. 34 is an expanded view of a portion of the upper arm assembly as shown in FIG. 33.

Referring to FIGS. 33 and 34, the upper end of each connector rod 5420 is keyed to a respective eccentric member 5440. Eccentric members 5440 are configured to rotate eccentrically about the axis of connector rod 5420. A respective clamping arm 5430 is positioned adjacent to each eccentric member 5440. Each clamping arm 5430 includes fixed leg 5432, moveable leg 5434 and u-shaped portion 5436 joining legs 5432 and 5434. Clamping aperture 5438 is defined by legs 5432 and 5434 and u-shaped portion 5436 and is configured to receive an upper portion of a respective pivot axel 5210, 5910. The diameter of clamping aperture 5438 varies based on the relative position of moveable leg 5434 to fixed leg 5432. If moveable leg 5434 is spaced sufficiently from fixed leg 5432, clamping aperture 5438 will have a diameter greater than the diameter of the respective pivot axel 5210, 5910 and the pivot axel 5210, 5910 will be free to pivot. As moveable leg 5434 is moved closer to fixed leg 5432, the diameter of clamping aperture 5438 will be reduced. Upon sufficient movement, the diameter of clamping aperture 5438 will be reduced to an extent such that clamping aperture 5438 clamps on the respective pivot axel 5210, 5910 and prevents pivoting thereof.

Referring to FIG. 34, an initial, unlocked position of clamping arm 5430 is defined by a preload adjustment screw 5450 extending through a preload block 5452. Preload adjustment screw 5450 is tightened to move moveable leg 5434 closer to fixed leg 5432 and loosened to separate them. By adjusting preload adjustment screw 5450, an initial diameter of clamping aperture 5438 may be set to a dimension which allows the respective pivot axel 5210, 5910 to pivot with a desired amount of resistance. A bearing screw 5460 extends from a side of moveable leg 5434 and is engaged by eccentric member 5440. After preload adjustment screw 5450 is set and with eccentric member 5440 in an unlocked position, bearing screw 5460 is adjusted such that it head bears against eccentric member 5440. The unlocked position of clamping mechanism 5400 is thereby set. To lock clamping mechanism 5400, either handle 5410a,b is rotated such that connector rod 5420 rotates and causes eccentric member 5440 to rotate therewith. As eccentric member 5440 rotates to a locked position, it pushes on bearing screw 5460 and forces moveable leg 5434 toward fixed leg 5432, thereby reducing the dimension of clamping aperture 5438 until clamping arm 5430 clamps unto the respective pivot axel 5210, 5910. To unlock clamping mechanism 5400, either handle 5410a,b is rotated the opposite direction such that eccentric member 5440 rotates to its unlocked position. Preferably a compression spring (not shown) is provided between legs 5432 and 5434 to bias moveable leg 5434 to the unlocked position. A spring hole 5470 and a spring retaining pin 5472 are illustrated in FIG. 34. A corresponding clamping arm may also, or alternatively, be positioned in the lower portion of upper arm block 5310 to engage the lower portion of the pivot axel.

Figure 35:
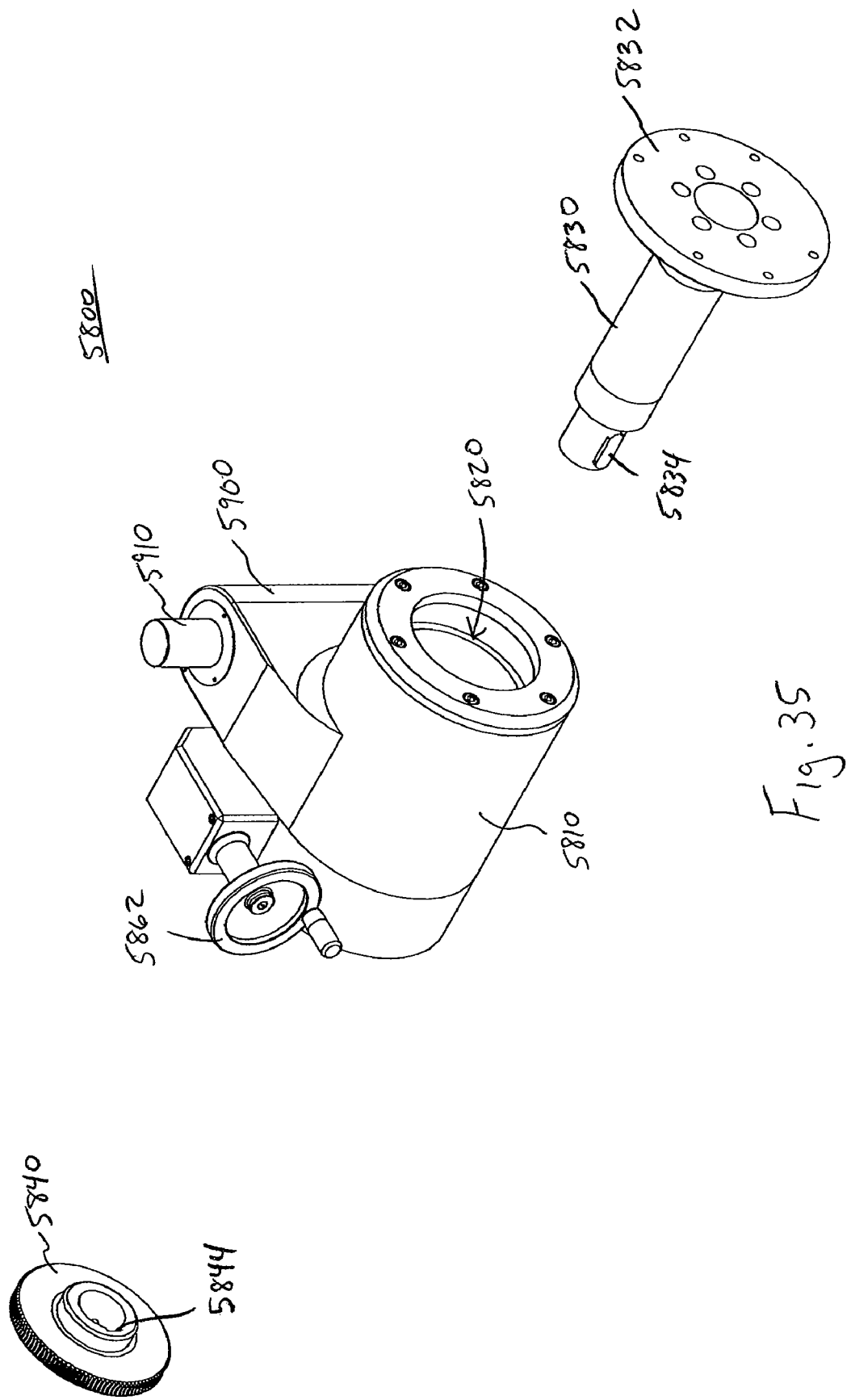
FIG. 35 is an exploded view of an exemplary roll gear box assembly.
Figure 36:
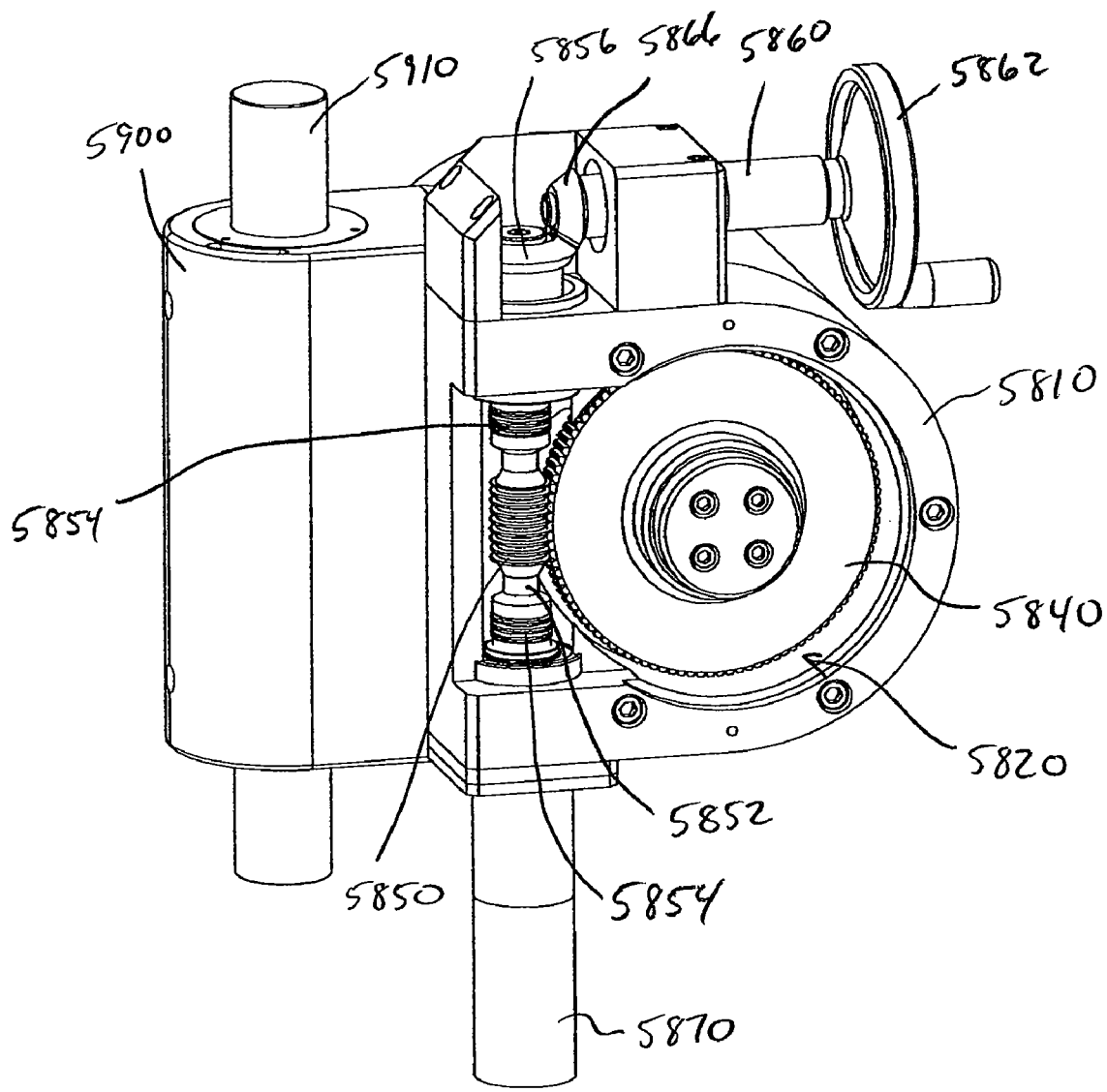
FIG. 36 is an assembled, partially cut away, rear perspective view of the roll gear box assembly of FIG. 35 with a rear cover removed.

Roll gear box assembly 5800 will be further described with respect to FIGS. 35 and 36. As explained above, pivot axel 5910 is pivotally supported by upper arm assembly 5300. Pivot block 5900 extends from housing 5810. Housing 5810 has a generally open through passage 5820 configured to receive roll shaft 5830. Roll shaft 5830 supports coupling 5832 at one end and includes key 5834 at its opposite end configured to mate with key slot 5844 in roll gear 5840. Coupling 5832 is configured to support cradle 3000 (see FIG. 1) and is supported with shaft 5830 for rotation about the axis of roll shaft 5830.

Referring to FIG. 36, roll gear 5840 is supported in housing 5810 and is also supported with shaft 5830 for rotation about the axis of roll shaft 5830. Roll gear 5840 engages a vertically extending worm gear 5850. Worm gear 5850 is slidingly mounted to a central axle 5852. One end of axle 5852 terminates in bevel gear unit 5856 which engages bevel gear unit 5866 attached to wheel shaft 5860 which is supported perpendicular to central axle 5852. The opposite end of wheel shaft 5860 includes a wheel 5862. Rotation of wheel 5862 rotates wheel shaft 5860 which in turn rotates central axle 5854 via engagement of bevel gear units 5856 and 5866. Rotation of central axle 5854 causes worm gear 5850 to rotate which in turn rotates roll gear 5840. As such, wheel 5862 may be used to roll cradle 3000 attached to coupling 5832. Alternatively or additionally, motor 5870 may be attached to central axle 5852 to automate roll motion control.

In the present embodiment, Bellville washers 5854 at each end of the worm gear 5850 locate it within housing 5810. Bellville washers 5854 act as compression springs such that the load coupled to roll shaft 5830 may be rotated a few degrees (plus or minus) by an external force. Bellville washers 5854 allow this motion, but then exert a counter force to push the load back to the neutral position when the external force is released. Thus, roll compliance and resilience are provided.

The illustrated cradle 3000 is described in U.S. Provisional Patent Application 60/916,380 which is incorporated herein by reference. Cradle 3000 provides approximately plus or minus 90 degrees of driven tumble motion including approximately five degrees of compliance. Cradle 3000 also provides a few millimeters of linear compliance parallel to the cradle arms. Cradle 3000 further provides approximately plus or minus 2.5 degrees of rotational compliance about an axis which is orthogonal to the plane defined by the cradle arms. The illustrated cradle 3000 is an exemplary cradle and the invention is not limited to such. Cradle 3000 can have various configurations and is not limited to the configuration illustrated herein.

Referring to FIGS. 37-41, a manipulator system 10' that is an alternative embodiment of the invention will be described. Manipulator system 10' is substantially the same as the previously described manipulator system 10, but further includes cable support apparatus 7000. For simplicity, manipulator system 10' is illustrated in FIGS. 37-40 without the cradle, the test head, the tester cabinet, and interconnecting cables.

Figure 37:
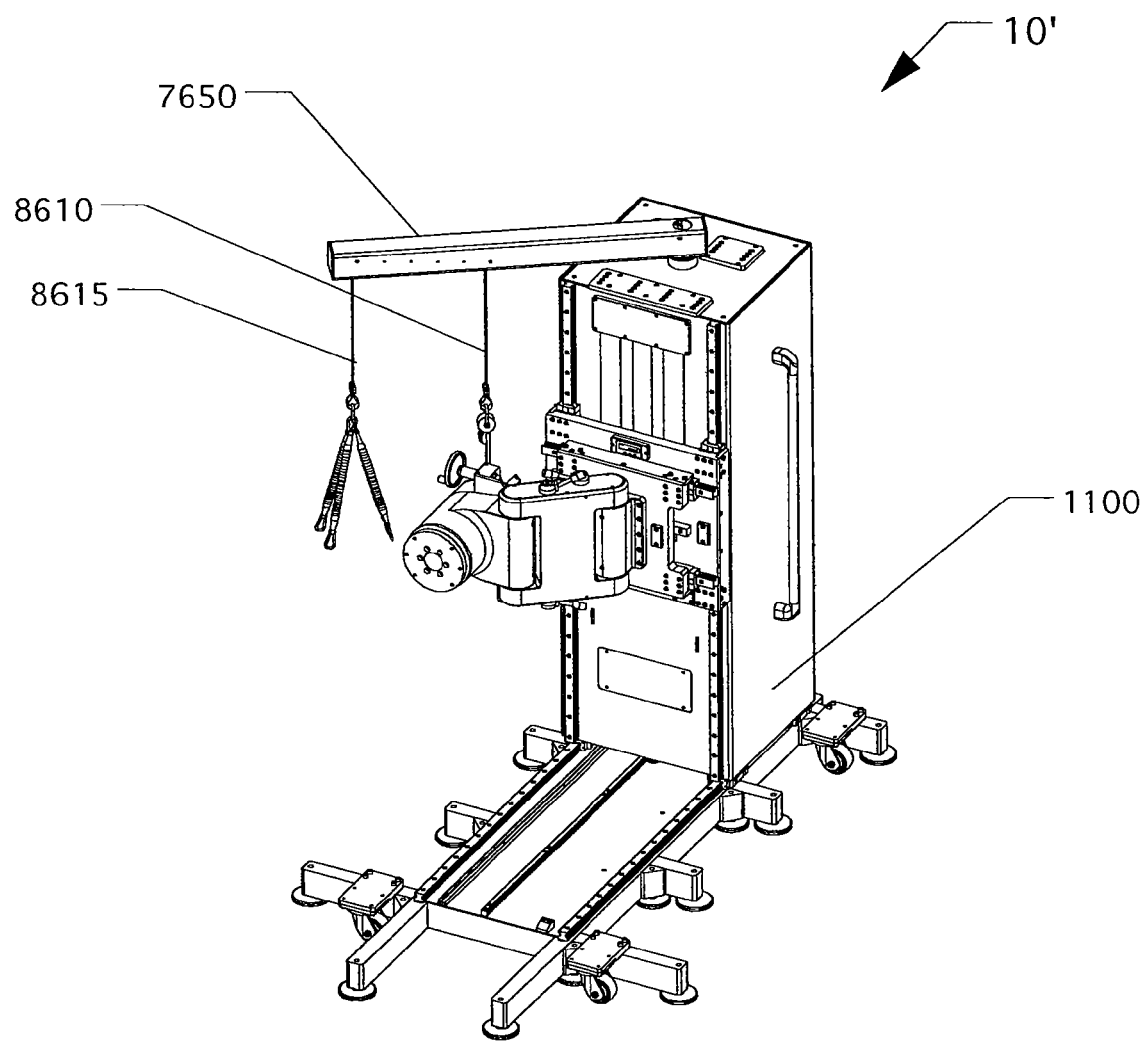
FIG. 37 is a perspective view of a manipulator system according to an alternative embodiment of the present invention.
Figure 38:
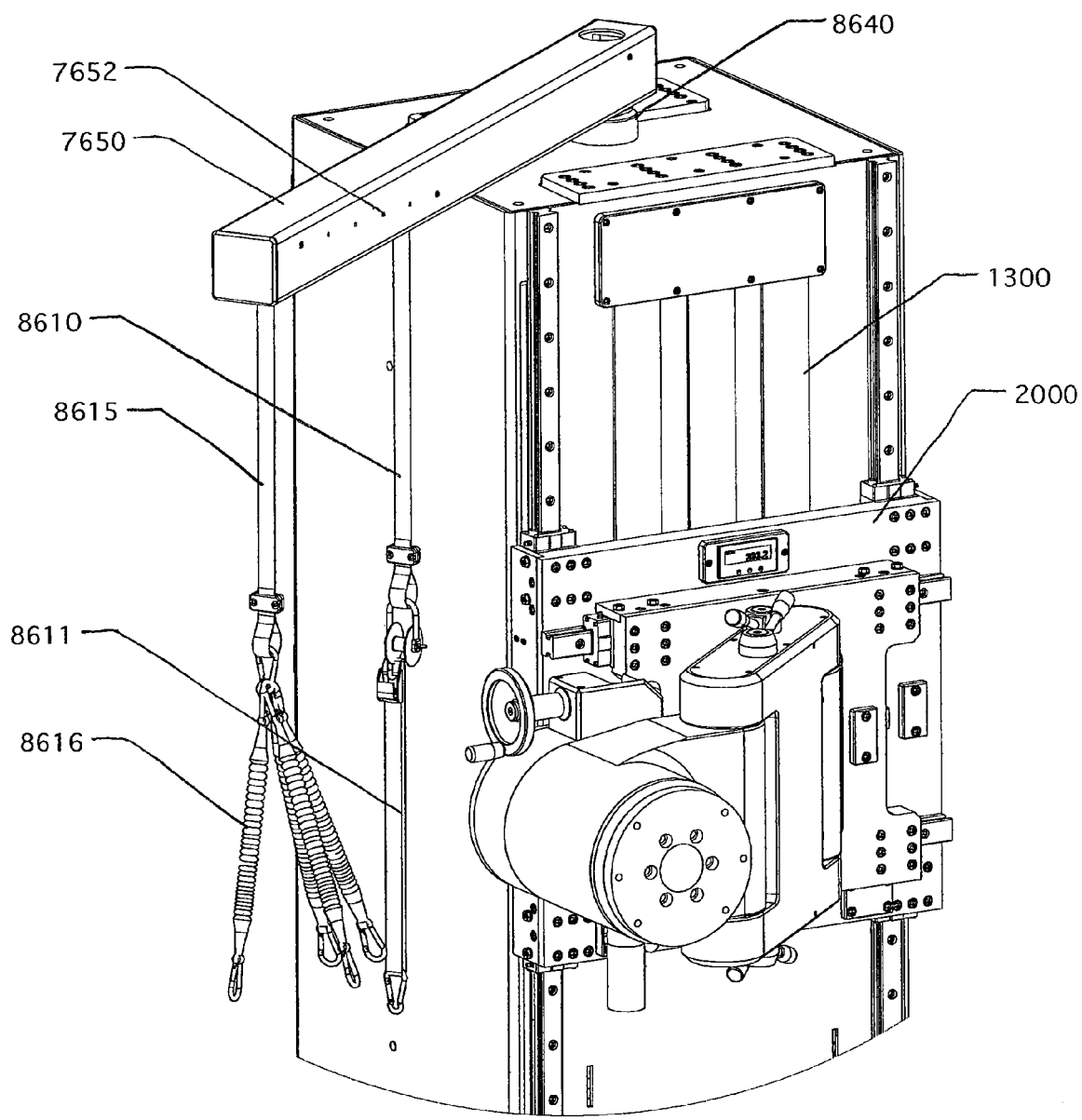
FIG. 38 is an expanded perspective view of a portion of the manipulator system of FIG. 37.
Figure 39:
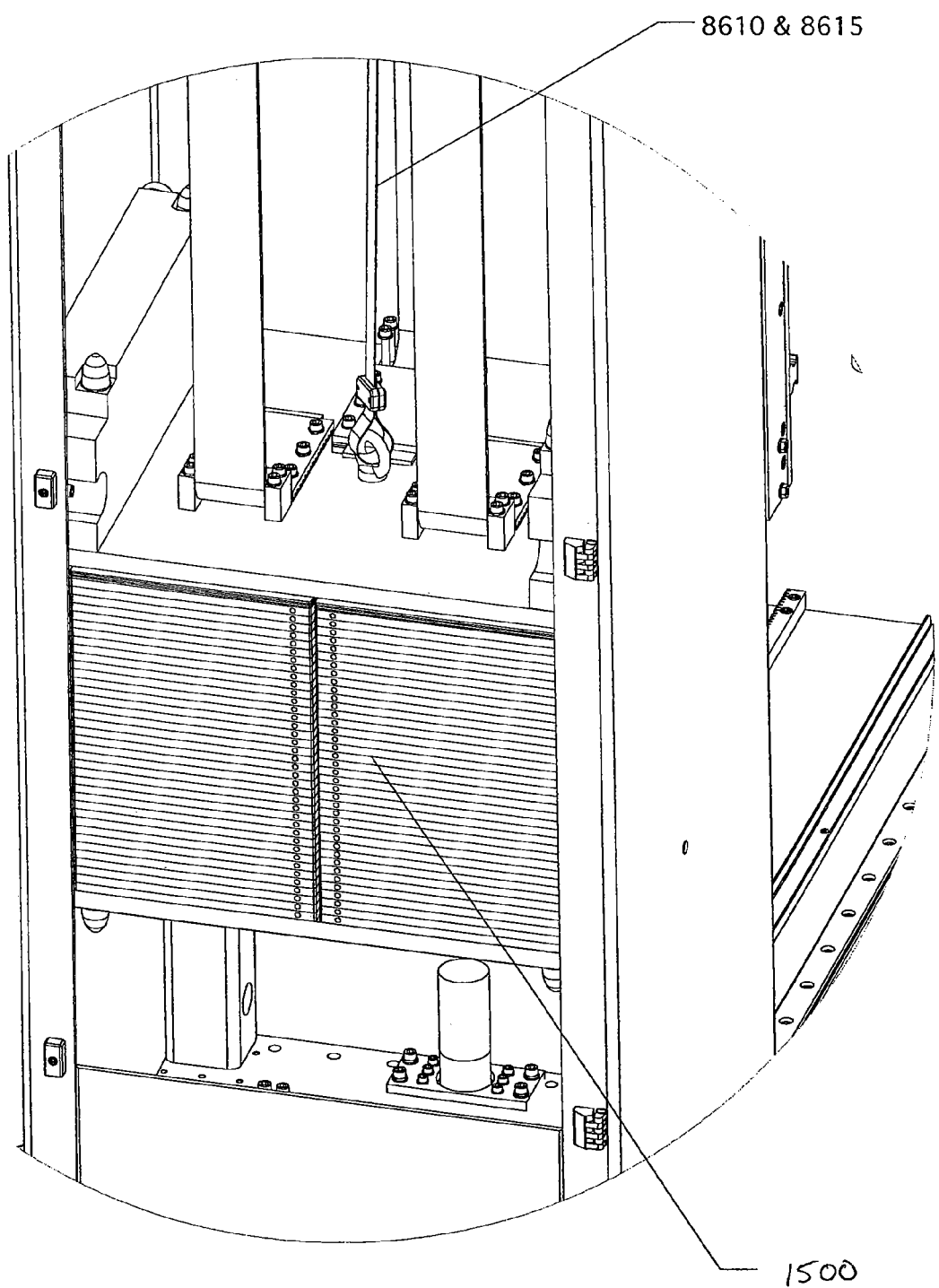
FIG. 39 is an expanded rear perspective view of a portion of the manipulator system of FIG. 37 with the rear access door removed.

Referring to FIGS. 37-39, tethers 8610 and 8615 are provided with appropriate coupling gear 8611 and 8616, such as slings or elastic cords, to support electrical wiring cables and coolant tubing or ducts which are coupled to the test head. Tethers 8610 and 8615 extend from boom 7650, which is rotatably coupled to the top 1162 of column 1100 by means of swivel coupling 8640. Thus, boom 7650 may pivot about a vertical axis extending through column 1100. Accordingly, as the test head is moved through its motion envelope, boom 7650 may rotate with it in order to maintain a near constant distance between the points of support for the cables and the test head.

In some applications, mere rotation of boom 7650 is not sufficient for effective cable control. It may also be desirable to provide vertical motion to the points of cable support. For example, it has been found that the amount and direction of vertical cable support motion that is desirable is dependent upon many factors including the size and resiliency of the cable itself, the motions required in day-to-day operation, the positions of the peripherals to be docked to, and other site specific factors. In some instances it may be desirable for the cable support points to move in the same direction as the test head. In other instances it has been found that moving the cable support in the opposite direction as the test head is beneficial, as this tends to keep the cable straight. In either case, there may be circumstances where it is desirable that the cable support points move the same distance as the test head. In other circumstances it may be desirable that the cable support points move a fraction of the distance that the test head moves.

Although manipulator system 10' is illustrated with two supports, it may be desirable to bundle two or more cable entities into a single cable entity. For example, a coolant tube and an air ducts might be bundled together into a single entity. For a given class of test system, such bundling could be different from one user site to the next. Thus, a system, which provides the flexibility of having a variable number of supports is desirable.

The present exemplary embodiment shown in FIGS. 37-39 provides two tethers 8610 and 8615 as supports. Tethers 8610 and 8615 are configured so that as the test head moves vertically, the supports also move vertically in the same direction and at the same rate (and thus the same distance) as the test head. Thus, for example, if the test head is raised one meter, the tethers 8610 and 8615 are also raised one meter.

In the exemplary embodiment of the present invention as illustrated in FIGS. 37-39, tethers 8610 and 8615 are routed, through appropriate openings, up into boom 7650 where they encounter pulleys which direct them along boom 7650 towards swivel coupling 8640. Tethers 8610 and 8615 are then directed downwards into column 1100 where they are routed and terminated to produce the desired motion effect.

Figure 40:
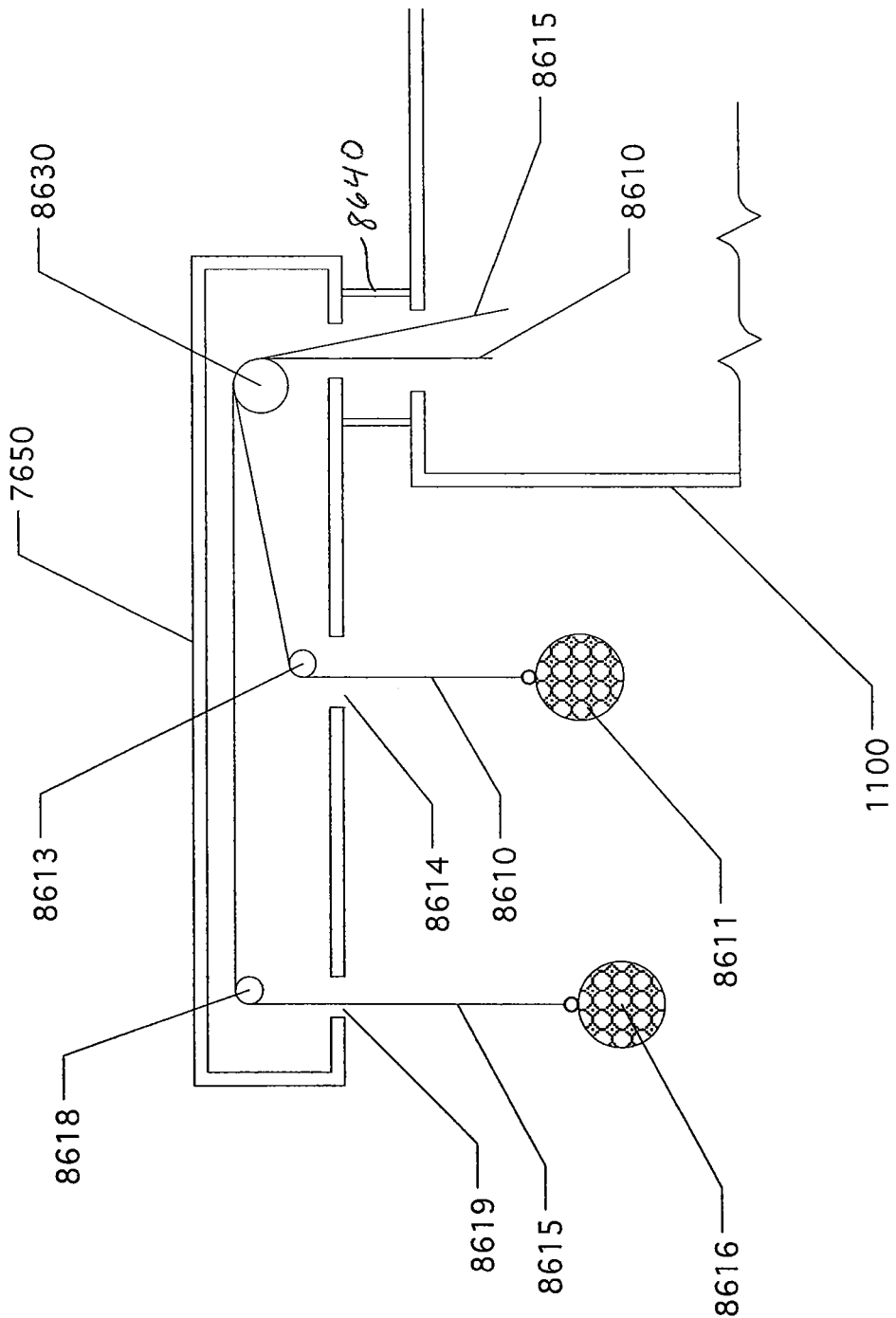
FIG. 40 is a schematic illustration of the cable support apparatus of the manipulator system of FIG. 37.

FIG. 40 provides a schematic illustration of the above. Two cable entities 8611 and 8616 are supported by tethers 8610 and 8615, respectively. Tethers 8610 and 8615 pass through respective openings 8614 and 8619 in the bottom of boom 7650 and then engage respective pulleys 8613 and 8618. Thus, tethers 8610 and 8615 are directed generally horizontally along boom 7650 towards column 1100. In the present exemplary embodiment, requirements can be satisfied by having both tethers behave in the same fashion. Thus, both tethers 8610 and 8615 move in unison; and both simultaneously engage single pulley 8630, which directs them downwards through swivel coupling 8640 into column 1100. Because, pulley 8630 is located approximately directly above swivel coupling 8640, boom 7650 may pivot approximately 90 degrees or more about swivel coupling 8640 without undue resistance from tethers 8610 and 8615 and without adversely effecting tethers 8610 and 8615.

If tethers 8610 and 8615 are made of a material that is round in cross section, such as rope, pulley 8630 may be one of a style that allows tethers 8610 and 8615 to ride it side-by-side (perhaps each having its own groove to prevent harmful over rides). However, in a preferred version of this exemplary embodiment, tethers 8610 and 8615 are made of a flat, woven strapping. In this case pulley 8630 may have a flat surface and tethers 8610 and 8615 may round pulley 8630 stacked one on top of another. If the diameter of pulley 8630 is relatively large in comparison to the thickness of the strapping, any slippage between adjacent straps will be minimal.

While two tethers are described and illustrated herein, any number of tethers may be accommodated, for example from just one to as many as four or more. Thus, a system may be designed and manufactured so that it can be adapted to handle any reasonable number of tethers according to application and situational needs that are not known a priori. In FIG. 38, for example, a number of pulley mounting points 7652 are shown, which enable a variable number of pulleys and pulley locations, enabling the system to be adapted to different situations and changing needs.

In FIG. 39, which is a detailed rear view of column 1100 with the rear door removed, it is seen that tethers 8610 and 8615 are directed downwards and are fastened to an eyebolt attached to the upper surface of the counterweight assembly 1500. Thus, the test head load, the counterweights and the tethers will all move vertically as a single unit. The situation is illustrated schematically for a single tether, say tether 8610, in FIG. 41.

Figure 41:
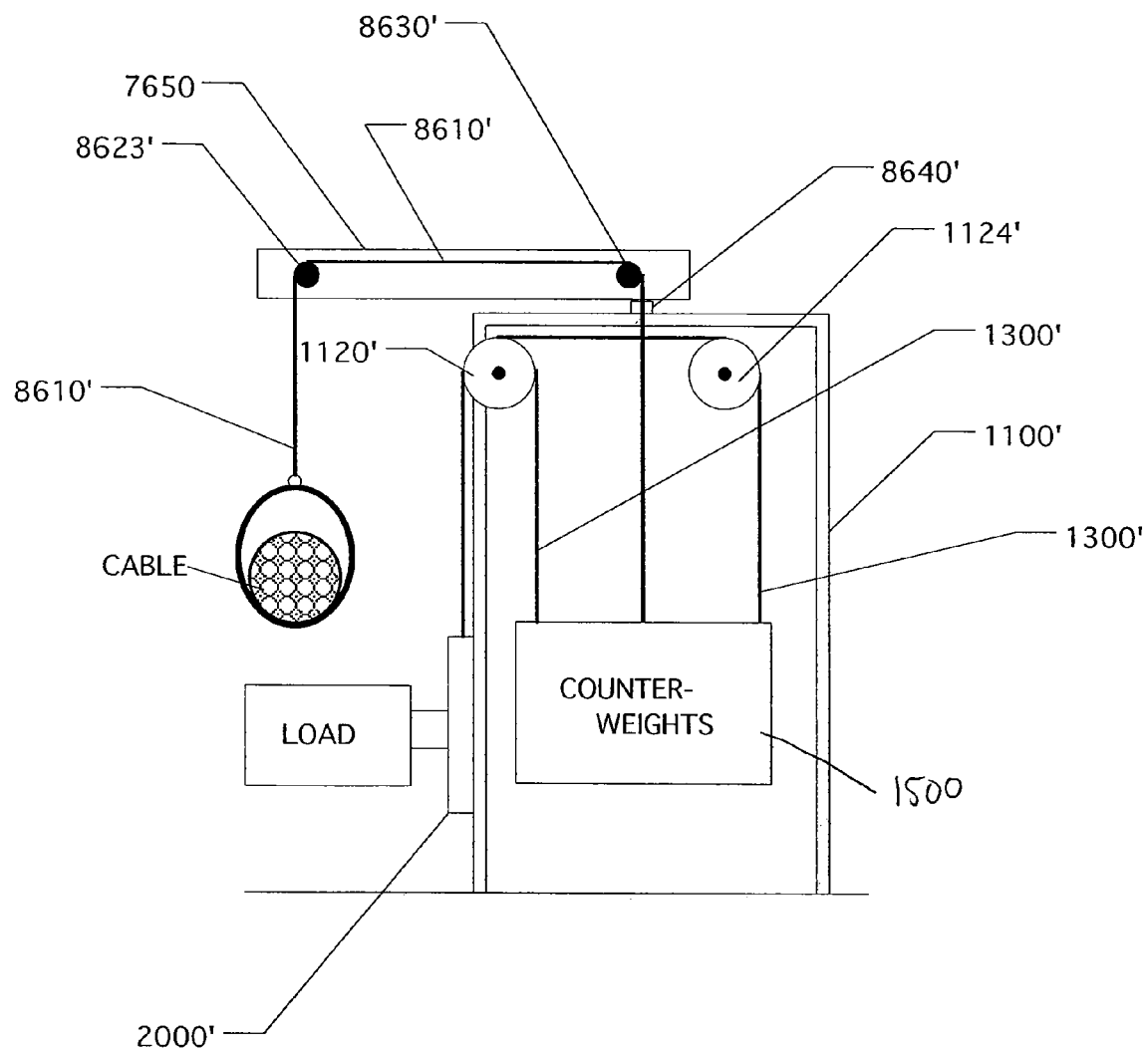
FIG. 41 is a schematic illustration of the manipulator system of FIG. 37.

In FIG. 41, a LOAD is supported by vertical carriage 2000' that may move vertically along column 1100'. Carriage 2000' is supported by load carrying straps 1300' that are coupled to the COUNTERWEIGHTS. Straps 1300' are passed over respective pulleys 1120' and 1124' near the top of column 1100, reversing their direction in traveling from the LOAD to the COUNTERWEIGHTS. Thus, as the LOAD moves upwards, the COUNTERWEIGHTS move downwards and vice versa. The illustrated CABLE is supported by tether 8610'. Although not shown, the CABLE may be assumed to be coupled to the LOAD. Tether 8610' passes over pulleys 8623' and 8630' within boom 7650' and is finally attached to the COUNTERWEIGHTS. Thus, for example, as the LOAD is moved up a distance X, the COUNTERWEIGHTS move down the same distance X, causing the CABLE to be raised the distance X. Accordingly, this arrangement causes the CABLE support to be moved in the same direction and the same distance as the test head as desired.

While exemplary embodiments of the invention have been shown and described herein, it will be understood that such embodiments are provided by way of example only. Numerous variations, changes and substitutions will occur to those skilled in the art without departing from the spirit of the invention. Examples of such variations are included below.

The positioner system is not limited to electronic device testing equipment, as other applications and industries are envisioned. The positioner system may be utilized in X-Ray machines, or any other automated load bearing equipment. Accordingly, the term "load" recited in the appended claims is not limited to a test head, and may represent any object. Also, the positioner system is not limited to electrically-powered motors or actuators, as other power systems are envisioned such as pneumatic, air-powered pneumatics, hydraulics, motors, gears, internal combustion, etc.

Accordingly, it is intended that the appended claims cover all such variations as fall within the spirit and scope of the invention.

What is claimed:

1. A manipulator for translating a load along an axis of translation, said manipulator comprising:
    a column assembly;
    a carriage supported by the column assembly and configured to move along the axis of translation;
    a lock assembly attached to the carriage, the lock assembly including a member axially moveable relative to the carriage between an unlocked position wherein the member is disengaged from the column assembly and a locked position wherein the member is engaged with the column assembly.

2. The manipulator of claim 1 wherein the member is a tang configured to engage a slot defined by the column assembly in the locked position.

3. The manipulator of claim 2 wherein the tang includes at least one hook extending outward from a main body of the tang in a direction perpendicular to the direction of axial travel of the tang between the locked and unlocked positions.

4. The manipulator of claim 3 wherein the at least one hook remains aligned with the slot when the carriage is in a balanced condition and moves to a non-aligned position such that the tang can not be removed from the slot when the carriage is in an unbalanced condition.

5. The manipulator of claim 2 wherein the first and second holes are defined along the tang axially spaced along an axis extending in the direction of axial travel of the tang and wherein a tip portion of a threaded screw is received in the first hole in the unlocked position and the tip portion of the threaded screw is received in the second hole in the locked position.

6. The manipulator of claim 1 wherein the member is a lock shaft having a foot pad configured to frictionally engage the column assembly in the locked position.

7. The manipulator of claim 6 wherein the lock shaft is supported relative to a handle including a cam surface, wherein in the locked position, a radially extending portion of the cam surface engages the lock shaft and forces the foot pad into frictional engagement with the column assembly and in the unlocked position, the lock shaft is aligned with a radially blunted portion of the cam surface such that the lock shaft is moveable away from the column assembly.

8. The manipulator of claim 7 wherein the lock shaft is biased away from the column assembly.

9. The manipulator of claim 6 wherein the axis of translation is a vertical axis.

10. The manipulator of claim 6 wherein the axis of translation is a horizontal axis.

\* \* \* \* \*